United States Patent
Yamakoshi et al.

(10) Patent No.: US 9,196,363 B2
(45) Date of Patent: Nov. 24, 2015

(54) SEMICONDUCTOR DEVICE

(71) Applicant: Renesas Electronics Corporation, Kawasaki-shi, Kanagawa (JP)

(72) Inventors: Hideaki Yamakoshi, Kanagawa (JP); Daisuke Okada, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/584,533

(22) Filed: Dec. 29, 2014

(65) Prior Publication Data
US 2015/0187782 A1 Jul. 2, 2015

(30) Foreign Application Priority Data

Dec. 27, 2013 (JP) ................................ 2013-272503

(51) Int. Cl.
G11C 16/04 (2006.01)
H01L 27/115 (2006.01)
G11C 16/10 (2006.01)

(52) U.S. Cl.
CPC ............ *G11C 16/0441* (2013.01); *G11C 16/10* (2013.01); *H01L 27/11519* (2013.01); *H01L 27/11521* (2013.01)

(58) Field of Classification Search
CPC ............... H01L 21/823493; H01L 21/823892; H01L 27/0928; H01L 2924/1434; H01L 2924/1436; H01L 2924/1437; H01L 2924/1438
See application file for complete search history.

(56) References Cited

U.S. PATENT DOCUMENTS

| 7,460,396 | B2 | 12/2008 | Oka et al. |
| 7,671,401 | B2 * | 3/2010 | Fang et al. ................... 257/318 |
| 7,940,561 | B2 * | 5/2011 | Shiba et al. ............. 365/185.01 |
| 8,351,254 | B2 | 1/2013 | Taniguchi |
| 2011/0305084 | A1 * | 12/2011 | Park ......................... 365/185.08 |

FOREIGN PATENT DOCUMENTS

| JP | 2007-110073 A | 4/2007 |
| JP | 2011-9454 A | 1/2011 |

OTHER PUBLICATIONS

Torricelli et al., "Half-MOS Single-Poly EEPROM Cell in Standard CMOS Process", IEEE Trans. Electron Devices, vol. 60, No. 6, pp. 1892-1897, Jun. 2013.

* cited by examiner

*Primary Examiner* — Jose R Diaz
(74) *Attorney, Agent, or Firm* — Miles & Stockbridge P.C.

(57) ABSTRACT

Provided is a semiconductor device having improved performance. The semiconductor device includes the memory cells of a flash memory. Each of the memory cells includes a capacitor element for writing/erasing data having a gate electrode formed of a part of a floating gate electrode, and a MISFET for reading data having a gate electrode formed of another part of the floating gate electrode. The capacitor element for writing/erasing data has a p-type semiconductor region and an n-type semiconductor region which have opposite conductivity types. The length of the floating gate electrode in a gate length direction in the capacitor element for writing/erasing data is smaller than the length of the floating gate electrode in the gate length direction in the MISFET for reading data.

17 Claims, 22 Drawing Sheets

SEMICONDUCTOR DEVICE

CROSS-REFERENCE TO RELATED APPLICATION

The disclosure of Japanese Patent Application No. 2013-272503 filed on Dec. 27, 2013 including the specification, drawings and abstract is incorporated herein by reference in its entirety.

BACKGROUND

The present invention relates to a semiconductor device and can be used appropriately for, e.g., a semiconductor device having a semiconductor element formed in a semiconductor substrate.

Some of semiconductor devices have nonvolatile memories each for storing, e.g., information used during recovery from a defect or during trimming such as LCD (Liquid Crystal Display) image adjustment or relatively-small-capacity information such as the manufacturing number of the semiconductor in the inside thereof. Examples of such nonvolatile memories include a nonvolatile memory formed of a conductor film of polysilicon or the like.

Japanese Unexamined Patent Publication No. 2007-110073 (Patent Document 1) discloses such a nonvolatile memory formed of a conductor film of polysilicon or the like. In the nonvolatile memory disclosed in Patent Document 1, a floating gate electrode made of the conductor film of polysilicon or the like is formed over the main surface of a semiconductor substrate via a gate insulating film. In the nonvolatile memory disclosed in Patent Document 1, at respective positions where the floating gate electrode overlaps a plurality of active regions formed in the main surface of the semiconductor substrate, a capacitor portion for writing/erasing data, a transistor for reading data, and a capacitor portion are placed. In the non-volatile memory disclosed in Patent Document 1, in the capacitor element for writing/erasing data, data is rewritten using an FN (Fowler-Nordheim) tunnel current.

Japanese Unexamined Patent Publication No. 2011-9454 (Patent Document 2) discloses such a nonvolatile memory formed of a conductor film of polysilicon or the like. In the nonvolatile memory disclosed in Patent Document 2, over the main surface of a semiconductor substrate, a floating gate electrode made of a conductor film of polysilicon or the like is formed via a gate insulating film. In the nonvolatile memory disclosed in Patent Document 2, a charge storage portion having the floating gate electrode and a semiconductor region are formed.

In Non-Patent Document 1, a MTP (Multiple Time Programmable) nonvolatile memory is disclosed. In the nonvolatile memory disclosed in Non-Patent document 1, over the main surface of a semiconductor substrate, a floating gate electrode made of a conductor film of polysilicon or the like is formed via a gate insulating film. In the nonvolatile memory disclosed in Non-Patent document 1, at respective positions where the floating gate electrode overlaps two active regions formed in the main surface of the semiconductor substrate, a control gate capacitor element and a tunnel gate capacitor element are placed.

RELATED ART DOCUMENTS

Patent Documents

[Patent Document 1]
Japanese Unexamined Patent Publication No. 2007-110073

[Patent Document 2]
Japanese Unexamined Patent Publication No. 2011-9454

Non-Patent Document

[Non-Patent Document 1]
IEEE Trans. Electron Devices, Vol. 60, pp. 1892-1897, 2013.

SUMMARY

In a semiconductor device including such a nonvolatile memory using a floating gate electrode made of a conductor film of polysilicon or the like, the floating gate electrode can be formed in the same step of forming the gate electrode of a MISFET (Metal Insulator Semiconductor Field Effect Transistor) as a type of field effect transistor (FET). This can facilitate the manufacturing process of the semiconductor device, improve the manufacturing yield of the semiconductor device, and improve the reliability of the semiconductor device.

However, in a semiconductor device including such a nonvolatile memory using a floating gate electrode made of a conductor film of polysilicon or the like, the area occupied by each of memory cells is relatively large. Accordingly, the capacity of the nonvolatile memory cannot easily be increased and the performance of the semiconductor device cannot be improved.

Other problems and novel features of the present invention will become apparent from a statement in the present specification and the accompanying drawings.

According to an embodiment, a semiconductor device includes a memory cell of a nonvolatile memory. The memory cell includes an element for writing/erasing data having a gate electrode formed of a part of a floating gate electrode, and a field effect transistor for reading data having a gate electrode formed of another part of the floating gate electrode. The element for writing/erasing data have a pair of semiconductor regions having opposite conductivity types. A length of the floating gate electrode in a gate length direction in the element for writing/erasing data is smaller than a length of the floating gate electrode in the gate length direction in the field effect transistor for reading data.

According to the embodiment, the performance of the semiconductor device can be improved.

DETAILED DESCRIPTION

Figure 1:
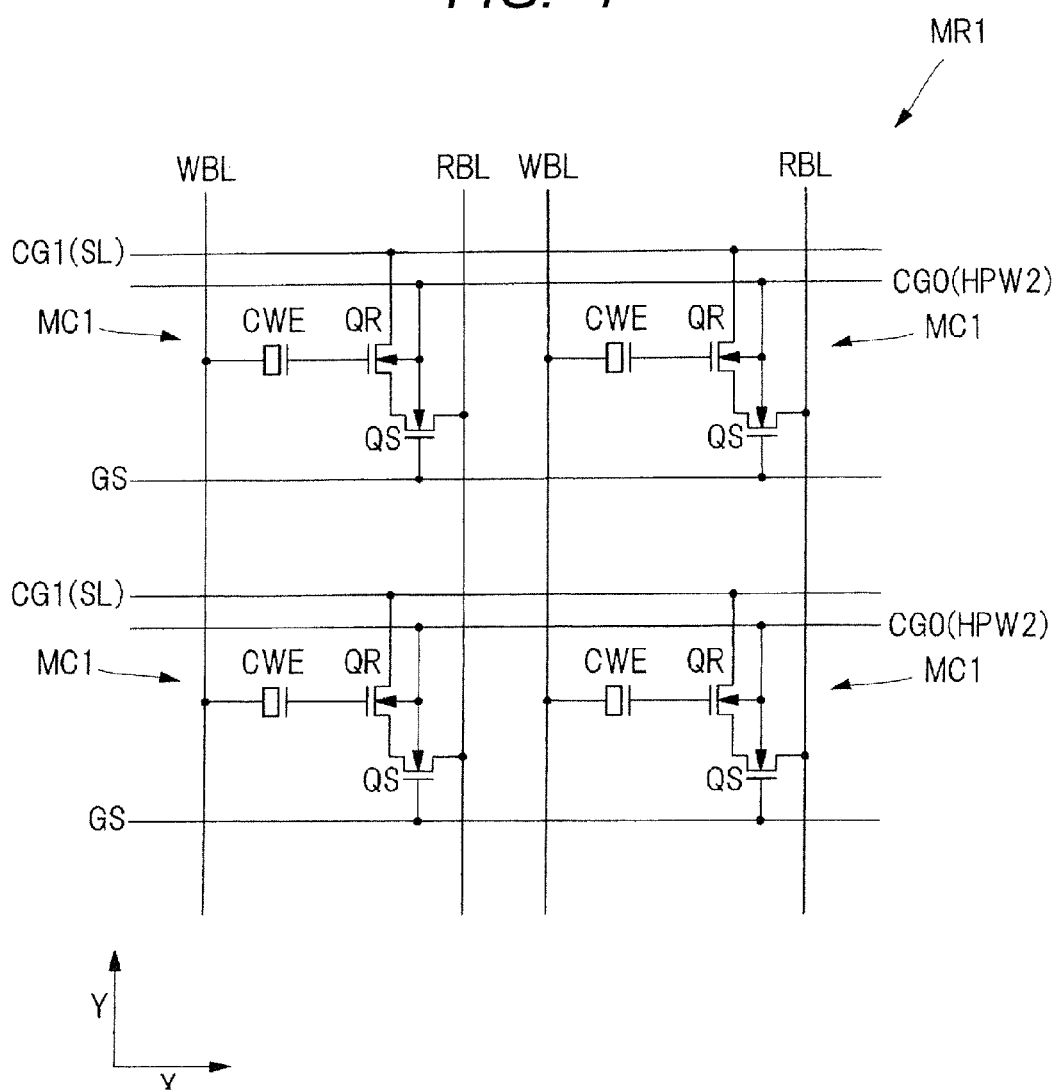
FIG. 1 is a main-portion circuit diagram of a flash memory in a semiconductor device in Embodiment 1.

In the following embodiments, if necessary for the sake of convenience, each of the embodiments will be described by being divided into a plurality of sections or embodiments. However, they are by no means irrelevant to each other unless particularly explicitly described otherwise, and one of the sections or embodiments is modifications, details, supplementary explanation, and so forth of part or the whole of the others.

Also in the following embodiments, when the number and the like (including the number, numerical value, amount, range, and the like) of elements are mentioned, they are not limited to specific numbers unless particularly explicitly described otherwise or unless they are obviously limited to the specific numbers. The number and the like of the elements may be not less than or not more than the specific numbers.

Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes, positional relationships, and the like are assumed to include those substantially proximate or similar thereto and the like unless particularly explicitly described otherwise or unless it can be considered that they obviously do not in principle. The same shall apply to the foregoing numerical value and range.

Hereinbelow, the representative embodiments will be described in detail on the basis of the drawings. Note that, throughout all the drawings for illustrating the embodiments, members having the same functions are designated by the same reference numerals, and the repeated description thereof is omitted. Also, in the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

(Embodiment 1)

First, a description will be given of a semiconductor device in Embodiment 1. In the semiconductor device in Embodiment 1, a main circuit and a flash memory as a nonvolatile memory which stores relatively-small-capacity intended information related to the main circuit are formed in the same semiconductor chip.

Examples of the foregoing main circuit include a memory circuit such as a DRAM (Dynamic Random Access Memory) or an SRAM (Static Random Access Memory), a logic circuit such as a CPU (Central Processing Unit) or an MPU (Micro Processing Unit), and a mixed-signal circuit in which such a memory circuit and such a logic circuit are embedded. Examples of the foregoing main circuit also include an LCD (Liquid Crystal Device) driver circuit. Examples of the foregoing intended information includes information on the address in a semiconductor chip where an element used in trimming is placed, information on the address where a memory cell or an LCD element used in recovering the memory circuit or LCD driver circuit is placed, trimming tap information for an adjustment voltage used in adjusting an LCD image, and the manufacturing number of a semiconductor device.

<Circuit Configuration of Semiconductor Device>

A description will be given first of a circuit configuration of the semiconductor device in Embodiment 1. FIG. 1 is a main-portion circuit diagram of the flash memory in the semiconductor device in Embodiment 1. It is assumed that, in the plane shown in FIG. 1, the two directions crossing to each other, or preferably orthogonal to each other, are an X-axis direction and a Y-axis direction.

The flash memory in the semiconductor device in Embodiment 1 has a memory cell array MR1. In the memory cell array MR1, a plurality of bit lines WBL for writing/erasing data each extending in the Y-axis direction are arranged along the X-axis direction crossing, or preferably orthogonal to, the Y-axis direction. Also, in the memory cell array MR1, a plurality of bit lines RBL for reading data each extending in the Y-axis direction are arranged along the X-axis direction. Also, in the memory cell array MR1, a plurality of control gate lines CG1 and CG0 each extending along the X-axis direction and crossing the bit lines WBL and RBL are arranged along the Y-axis direction. Also, in the memory cell array MR1, a plurality of selection lines GS each extending along the X-axis direction and crossing the bit lines WBL and RBL are arranged along the Y-axis direction.

Note that each of the plurality of control gate lines CG1 is used also as a source line SL. Each of the plurality of control gate lines CG0 is used also as a p-type well HPW2 which will be described using FIGS. 2 and 3 described later. The control gate lines CG1 and CG0 will be simply referred to also as word lines.

Each of the bit lines WBL for writing/erasing data is electrically coupled to an inverter circuit for inputting data placed in a peripheral circuit region as a region outside the region where the memory cell array MR1 is formed, though the illustration thereof is omitted. Each of the bit lines RBL for reading data is electrically coupled to a sense amplifier circuit placed in the peripheral circuit region.

In the vicinity of the points of intersection between the bit lines WBL and RBL and the control gate lines CG1 and the selection lines GS, memory cells MC1 each corresponding to one bit are electrically coupled thereto. FIG. 1 illustrates an exemplary case where one bit is formed of one of the memory cells MCi.

Each of the memory cells MC1 includes a capacitor element CWE for writing/erasing data, a MISFET QR for reading data, and a selection MISFET QS. Note that, as described above, a MISFET is a type of FET. The selection MISFET QS is a selection MISFET for selecting the memory cell MCi.

One of the electrodes of the capacitor element CWE for writing/erasing data is electrically coupled to one of the bit lines WBL for writing/erasing data. The other electrode of the capacitor element CWE for writing/erasing data is formed of a part of a floating gate electrode FG, which will be described using FIGS. 2 and 3 described later. The gate electrode of the MISFET QR for reading data is formed of another part of the floating gate electrode FG. Consequently, the other electrode of the capacitor element CWE for writing/erasing data is electrically coupled to the gate electrode of the MISFET QR for reading data. On the other hand, the drain of the MISFET QR for reading data is electrically coupled to one of the bit lines RBL for reading data via the selection MISFET QS. The source of the MISFET QR for reading data is electrically coupled to the control gate line CG1, which is used also as the source line SL. The gate electrode of the selection MISFET is electrically coupled to one of the selection lines GS.

<Configuration of Memory Cell>

Figure 2:
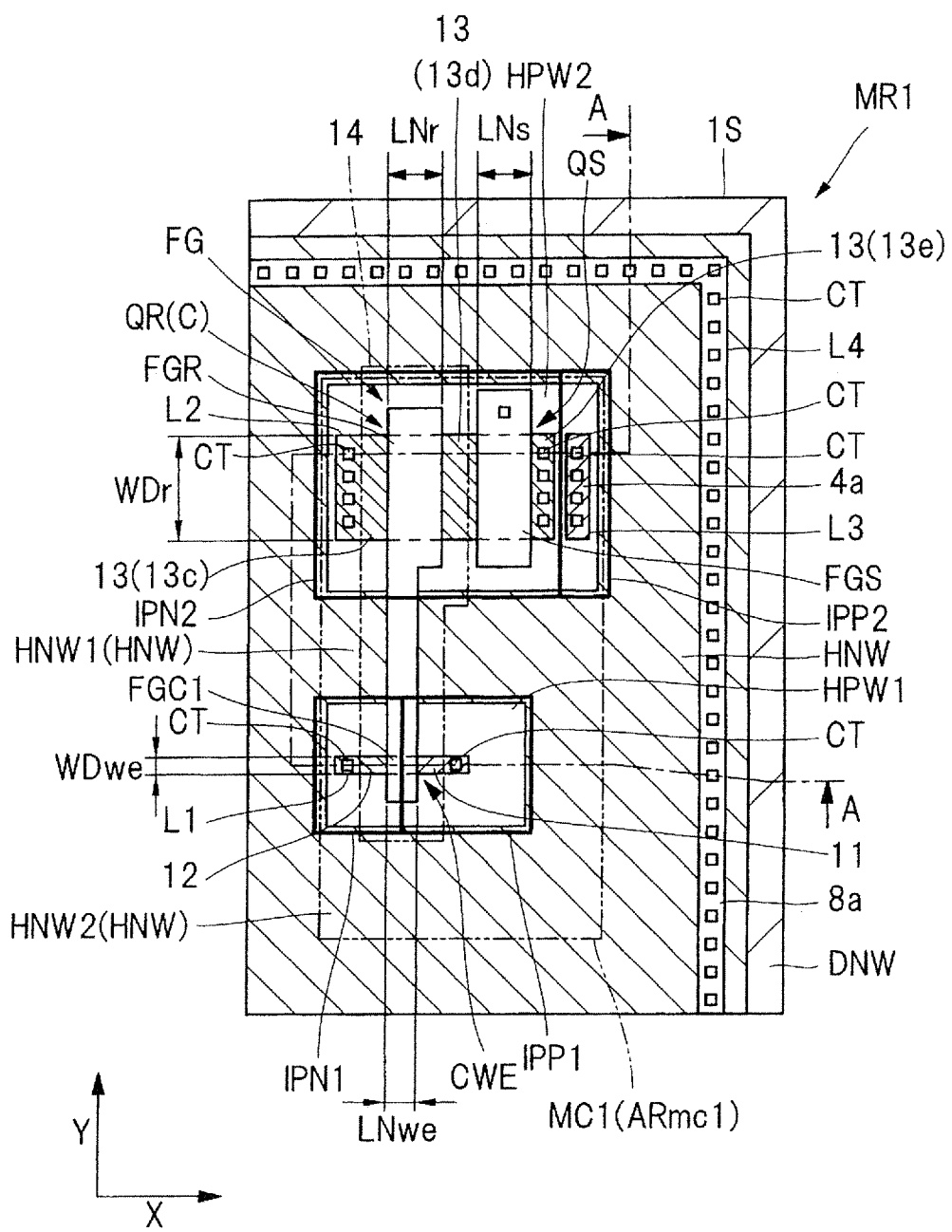
FIG. 2 is a plan view of each of memory cells in the semiconductor device in Embodiment 1.
Figure 3:
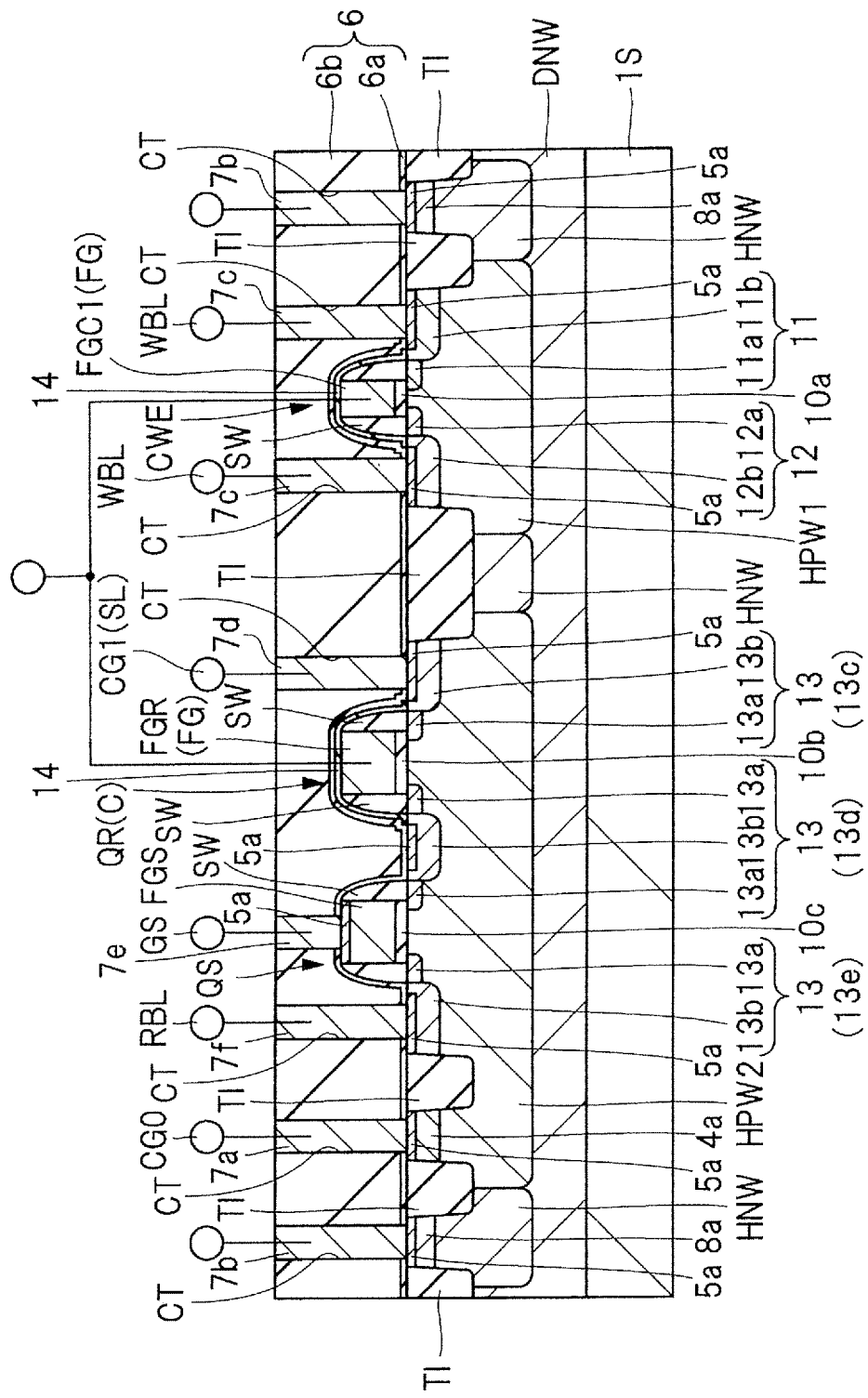
FIG. 3 is a cross-sectional view of the memory cell in the semiconductor device in Embodiment 1.

Next, a description will be given of a configuration of each of the memory cells of the flash memory in the semiconductor device in Embodiment 1. FIG. 2 is a plan view of each of the memory cells in the semiconductor device in Embodiment 1. FIG. 3 is a cross-sectional view of the memory cell in the semiconductor device in Embodiment 1. Each of FIGS. 2 and 3 shows the memory cell corresponding to one bit. FIG. 3 is a cross-sectional view along the line A-A in FIG. 2.

It is assumed that, in the plane shown in FIG. 2, the two directions crossing each other, or preferably orthogonal to each other, are the X-axis direction and the Y-axis direction. FIG. 2 shows the memory cell in a see-through state where conductor portions 7a to 7f, an insulating film 6, a cap insulating film 14, silicide layers 5a, sidewalls SW, and isolation portions TI have been removed. FIG. 2 shows only the outer periphery of the cap insulating film 14. For improved clarity of illustration, FIG. 2 is partly hatched.

As described above, each of the memory cells MCi of the flash memory in the semiconductor device in Embodiment 1 includes the floating gate electrode FG, the capacitor element CWE for writing/erasing data, and the MISFET QR for reading data.

A semiconductor substrate (hereinafter referred to simply as substrate) 1S forming the semiconductor device is made of, e.g., a silicon (Si) single crystal having a p-type conductivity type. In the substrate 1S, an n-type embedded well DNW having the conductivity type opposite to the p-type is formed to extend from the main surface of the substrate 1S to a predetermined depth. That is, in the main surface of the substrate 1S, the n-type embedded well DNW is formed.

In the main surface of the substrate 1S, the isolation portions TI are placed. The isolation portions TI define active regions L1, L2, L3, and L4. The isolation portions TI are trench-type isolation portions each referred to as a so-called SGI (Shallow Groove Isolation) or STI (Shallow Trench Isolation) formed by, e.g., embedding an insulating film made of silicon dioxide ($SiO_2$) or the like in the shallow trenches formed in the main surface of the substrate 1S.

In the n-type embedded well DNW, p-type wells HPW1 and HPW2 and an n-type well HNW are formed. The p-type wells HPW1 and HPW2 are located so as to be included in the n-type embedded well DNW, while being electrically isolated from each other by the n-type embedded well DNW and the n-type well HNW. The p-type well HPW2 is located so as to extend along the p-type well HPW1.

Each of the p-type wells HPW1 and HPW2 contains a p-type impurity such as, e.g., boron (B). In a part of the layer located over the p-type well HPW2, a $p^+$-type semiconductor region 4a as the active region L3 described above is formed. The $p^+$-type semiconductor region 4a contains the same impurity as contained in the p-type well HPW2, but the impurity concentration thereof in the $p^+$-type semiconductor region 4a is set higher than the impurity concentration thereof in the p-type well HPW2. The $p^+$-type semiconductor region 4a is electrically coupled to the conductor portion 7a in one of contact holes CT formed in an insulating film 6 over the main surface of the substrate 1S. In parts of the top surface layer of the $p^+$-type semiconductor region 4a which is in contact with the conductor portion 7a, silicide layers 5a each made of, e.g., cobalt silicide ($CoSi_x$) or the like may also be formed.

The n-type well HNW contains an n-type impurity such as, e.g., phosphorus (P) or arsenic (As). In parts of the layer located over the n-type well HNW, an $n^+$-type semiconductor region 8a are formed. The $n^+$-type semiconductor region 8a contains the same impurity as contained in the n-type well HNW, but the impurity concentration thereof in the $n^+$-type semiconductor region 8a is set higher than the impurity concentration thereof in the n-type well HNW.

The $n^+$-type semiconductor region 8a described above is electrically coupled to the conductor portions 7b in the contact holes CT formed in the insulating film 6. In parts of the top surface layer of the $n^+$-type semiconductor region 8a which is in contact with the conductor portions 7b, the silicide layers 5a may also be formed.

FIGS. 2 and 3 show an example in which the n-type well HNW is in contact with the p-type wells HPW1 and HPW2. However, the n-type well HNW may also be apart from the p-type well HPW1 or HPW2 so as not to come in contact with the p-type well HPW1 or HPW2. In other words, between the n-type well HNW and the p-type well HPW1 or HPW2, parts of the n-type embedded well DNW may also be interposed.

The floating gate electrode FG is a portion in which charges contributing to the storage of information are stored. The floating gate electrode FG is made of a conductor film of, e.g., low-resistance polysilicon or the like and formed in an electrically floating state, i.e., in a state insulated from another conductor. As shown in FIG. 2, the floating gate electrode FG is formed in a state extending along the Y-axis direction so as to two-dimensionally overlap the p-type wells HPW1 and HPW2. Note that the memory cell MC1 is also placed so as to two-dimensionally overlap the p-type wells HPW1 and HPW2.

At the position where the floating gate electrode FG two-dimensionally overlaps the active region Li of the p-type well HPW1, the capacitor element CWE for writing/erasing data is placed. The capacitor element CWE for writing/erasing data includes a capacitor electrode FGC1, a capacitor insulating film 10a, a p-type semiconductor region 11, an n-type semiconductor region 12, and the p-type well HPW1.

The capacitor electrode FGC1 is formed of a part of the floating gate electrode FG. In other words, the capacitor electrode FGC1 is the portion of the floating gate electrode FG which is formed at a position where the floating gate electrode FG two-dimensionally overlaps the active region L1 of the p-type well HPW1. The capacitor electrode FGC1 is also a portion forming the upper electrode of the capacitor element CWE.

The capacitor insulating film 10a is made of, e.g., silicon dioxide ($SiO_2$) and formed between the capacitor electrode FGC1 and the substrate 1S, i.e., the p-type well HPW1. The capacitor insulating film 10a has a thickness of, e.g., not less than 10 nm and not more than 20 nm. Note that, in the capacitor electrode CWE, in rewriting data, electrons or holes are injected from the p-type well HPW1 into the capacitor electrode FGC1 via the capacitor insulating film 10a or electrons or holes are released from the capacitor element FGC1 into the p-type well HPW1 via the capacitor insulating film 10a. Accordingly, the capacitor insulating film 10a has a small thickness which is set to, e.g., about 12 nm. The reason for setting the thickness of the capacitor insulating film 10a to a value of not less than 10 nm is that, if the thickness of the capacitor insulating film 10a is smaller than the value, the reliability of the capacitor insulating film 10a cannot be ensured. The reason for setting the thickness of the capacitor insulating film 10a to a value of not more than 20 nm is that, if the thickness of the capacitor insulating film 10a is larger than the value, it is difficult to allow electrons or holes to pass through the capacitor insulating film 10a and rewriting of data cannot easily be performed.

The p-type semiconductor region 11 and the n-type semiconductor region 12 are formed at respective positions in the p-type well HPW1 between which the capacitor electrode FGC1 is two-dimensionally interposed by self-alignment with the capacitor electrode FGC1.

The p-type semiconductor region 11 includes a channel-side $p^-$-type semiconductor region 11a, and a $p^+$-type semiconductor region 11b coupled to the $p^-$-type semiconductor region 11a. Each of the $p^-$-type semiconductor region 11a and the $p^+$-type semiconductor region 11b contains a p-type impurity such as, e.g., boron (B). However, the impurity concentration thereof in the $p^+$-type semiconductor region 11b is set higher than the impurity concentration thereof in the $p^-$-type semiconductor region 11a. The p-type semiconductor region 11 is electrically coupled to the conductor portion 7c in one of the contact holes CT formed in the insulating film 6. The conductor portion 7c is electrically coupled to the bit line WBL for writing/erasing data. In a part of the top surface layer of the $p^+$-type semiconductor region 11b which is in contact with the conductor portion 7c, the silicide layer 5a may also be formed.

The p-type semiconductor region 11 is electrically coupled to the p-type well HPW1. Accordingly, the p-type well HPW1 is the portion forming the lower electrode of the capacitor element CWE.

The n-type semiconductor region 12 includes a channel-side $n^-$-type semiconductor region 12a, and an $n^+$-type semiconductor region 12b coupled to the $n^-$-type semiconductor region 12a. Each of the $n^-$-type semiconductor region 12a and the $n^+$-type semiconductor region 12b contains an n-type impurity such as, e.g., phosphorus (P) or arsenic. However, the impurity concentration thereof in the $n^+$-type semiconductor region 12b is set higher than the impurity concentration thereof in the $n^-$-type semiconductor region 12a. The n-type semiconductor region 12 is electrically coupled to the conductor portion 7c in one of the contact holes CT formed in the insulating film 6. The conductor portion 7c is electrically coupled to the bit line WBL for writing/erasing data. In a part of the top surface layer of the $n^+$-type semiconductor region 12b which is in contact with the conductor portion 7c, the silicide layer 5a may also be formed.

Thus, at the positions in the p-type well HPW1 between which the capacitor electrode FGC1 is two-dimensionally interposed, the p-type semiconductor region 11 and the n-type semiconductor region 12 which are a pair of semiconductor regions having opposite conductivity types are formed. As a result, even when a voltage having either the positive polarity or the negative polarity is applied to the bit line WBL for writing/erasing data, no depletion layer is formed in a layer located over the portion where the capacitor electrode FGC1 two-dimensionally overlaps the active region L1 of the p-type well HPW1, i.e., the region corresponding to a channel. Therefore, it is possible to apply a voltage having either the positive polarity or the negative polarity to the portion of the p-type well HPW1 which faces the capacitor electrode FGC1.

On the other hand, at the position where the floating gate electrode FG two-dimensionally overlaps the active region L2 of the p-type well HPW2, the MISFET QR for reading data is placed. The MISFET QR for reading data includes a gate electrode FGR, a gate insulating film 10b, and a pair of n-type semiconductor regions 13. The channel of the MISFET QR for reading data is formed in a layer located over the portion where the gate electrode FGR two-dimensionally overlaps the active region L2 of the p-type well HPW2.

The gate electrode FGR is formed of a part of the floating gate electrode FG. In other words, the gate electrode FGR is the portion of the floating gate electrode FG which is formed at a position where the floating gate electrode FG two-dimensionally overlaps the active region L2 of the p-type well HPW2. In Embodiment 1, the MISFET QR for reading data functions also as a capacitor element C. Accordingly, the gate electrode FGR is also the portion forming the upper electrode of the capacitor element C.

The gate insulating film 10b is made of, e.g., silicon dioxide ($SiO_2$) and formed between the gate electrode FGR and the substrate 1S, i.e., the p-type well HPW2. The gate insulating film 10b has a thickness of, e.g., about 12 nm, which is similar to the thickness of the capacitor insulating film 10a.

The pair of n-type semiconductor regions 13 of the MISFET QR for reading data are formed at respective positions in the p-type well HPW2 between which the gate electrode FGR is two-dimensionally interposed by self-alignment with the gate electrode FGR.

Each of the pair of n-type semiconductor regions 13 of the MISFET QR for reading data includes a channel-side $n^-$-type semiconductor region 13a, and an $n^+$-type semiconductor region 13b coupled to the $n^-$-type semiconductor region 13a, similarly to the n-type semiconductor region 12 described above. Each of the $n^-$-type semiconductor region 13a and the $n^+$-type semiconductor region 13b contains an n-type impurity such as, e.g., phosphorus (P) or arsenic (As). However, the impurity concentration thereof in the $n^+$-type semiconductor region 13b is set higher than the impurity concentration thereof in the n⁻-type semiconductor region 13a.

The pair of n-type semiconductor regions 13 of the MISFET QR for reading data are referred to as n-type semiconductor regions 13c and 13d. At this time, the n-type semiconductor region 13c as one of the pair of n-type semiconductor regions 13 of the MISFET QR for reading data is electrically coupled to the conductor portion 7d in one of the contact holes CT formed in the insulating film 6. The conductor portion 7d is electrically coupled to the control gate line CG1, which is used also as the source line SL. Over a part of the top surface layer of the n⁺-type semiconductor region 13b which is in contact with the conductor portion 7d, the silicide layer 5a may also be formed. On the other hand, the n-type semiconductor region 13d as the other of the pair of n-type semiconductor regions 13 of the MISFET QR for reading data is shared as one of the pair of n-type semiconductor regions 13 of the selection MISFET QS described later by the MISFET QR for reading data and the selection MISFET QS.

As described above, the p-type well HPW2 is electrically coupled to the n⁺-type semiconductor region 8a. Accordingly, the p-type well HPW2 is the portion forming the lower electrode of the capacitor element C in the MISFET QR for reading data. That is, the p-type well HPW2 functions as the second control gate line CG0 of the memory cell.

The selection MISFET QS includes a gate electrode FGS, a gate insulating film 10c, and the pair of source/drain n-type semiconductor regions 13. The channel of the selection MISFET QS is formed in a layer located over the portion where the gate electrode FGS two-dimensionally overlaps the active region L2 of the p-type well HPW2.

The gate electrode FGS is made of a conductor film of, e.g., low-resistance polysilicon or the like. The gate electrode FGS is placed so as to extend in the Y-axis direction and two-dimensionally overlap the portion of the p-type well HPW2 opposite to the gate electrode FGR relative to the n-type semiconductor region 13d interposed therebetween and electrically isolated from the floating gate electrode FG. The gate electrode FGS is electrically coupled to the conductor portion 7e in one of the contact holes CT formed in the insulating film 6. The conductor portion 7e is electrically coupled to the selection line GS.

The gate insulating film 10c is made of, e.g., silicon dioxide ($SiO_2$) and formed between the gate electrode FGS and the substrate 1S, i.e., the p-type well HPW2. The gate insulating film 10c has a thickness of, e.g., about 12 nm, which is similar to the thickness of the capacitor insulating film 10a.

Each of the pair of n-type semiconductor regions 13 of the selection MISFET QS is similar to each of the n-type semiconductor regions 13 of the MISFET QR for reading data. The pair of n-type semiconductor regions 13 are formed at respective positions in the p-type well HPW2 between which the gate electrode FGS is interposed. As described above, the n-type semiconductor region 13d as one of the pair of n-type semiconductor regions 13 of the selection MISFET QS is shared by the MISFET QR for reading data and the selection MISFET QS. On the other hand, the n-type semiconductor region 13e as the other of the pair of n-type semiconductor regions 13 of the selection MISFET Q is electrically coupled to the conductor portion 7f in one of the contact holes CT formed in the insulating film 6. The conductor portion 7f is electrically coupled to the bit line RBL for reading data. In a part of the top surface layer of the n⁺-type semiconductor region 12b which is in contact with the conductor portion 7f, the silicide layer 5a may also be formed.

Over the side surfaces of the floating gate electrode FG, i.e., over the respective side surfaces of the capacitor electrode FGC1 and the gate electrode FGR and over the side surfaces of the gate electrode FGS, the sidewalls SW each made of, e.g., silicon dioxide ($SiO_2$) are formed. Over the upper surface of the floating gate electrode FG, i.e., over the respective upper surfaces of the capacitor electrode FGC1 and the gate electrode FGR, over the surfaces of the sidewalls SW formed over the respective side surface of the capacitor electrode FGC1 and the gate electrode FGR, and over the main surface of the portion of the substrate 1S located therearound, the cap insulating film 14 is formed.

The cap insulating film 14 is made of, e.g., silicon dioxide ($SiO_2$) and formed between the floating gate electrode FG and an insulating film 6a made of silicon nitride ($Si_3N_4$) and described later so as to prevent direct contact between the insulating film 6a and the upper surface of the floating gate electrode FG. For example, when the insulating film 6a made of silicon nitride is deposited by a plasma chemical vapor deposition (CVD) method or the like, a portion in which the composition ratio of silicon is high, i.e., a silicon-rich portion is likely to be formed in the insulating film 6a. In such a case, charges in the floating gate electrode FG may flow toward the substrate 1S through the silicon-rich portion of the insulating film 6a to be released through the conductor portion and possibly degrade the data retention property of the flash memory. However, by forming the cap insulating film 14 between the floating gate electrode FG and the insulating film 6a, it is possible to prevent or inhibit such a charge release as described above and thus improve the data retention property of the flash memory.

The silicide layers 5a are formed after the formation of the cap insulating film 14. Consequently, the silicide layers 5a are formed in the main surface of the substrate 1S, i.e., in the top surface layers of the p⁺-type semiconductor region 11b and the n⁺-type semiconductor regions 12b and 13b, but are not formed in the upper surface of the floating gate electrode FG.

Over the main surface of the substrate 1S including the top surface of the cap insulating film 14, the insulating film 6 is formed. Over the upper surface of the floating gate electrode FG, i.e., over the respective upper surfaces of the capacitor electrode FGC1 and the gate electrode FGR, over the surfaces of the sidewalls SW formed over the respective side surfaces of the capacitor electrode FGC1 and the gate electrode FGR, and over the main surface of the portion of the substrate 1S located therearound, the insulating film 6 is formed via the cap insulating film 14. The insulating film 6 includes the insulating film 6a, and an insulating film 6b deposited over the insulating film 6a. The lower-layer insulating film 6a is made of, e.g., silicon nitride ($Si_3N_4$). The upper-layer insulating film 6b is made of, e.g., silicon dioxide ($SiO_2$).

In Embodiment 1, a length LNwe of the capacitor electrode FGC1 of the capacitor element CWE for writing/erasing data in the X-axis direction is smaller than a length LNr of the gate electrode FGR of the MISFET QR for reading data in the X-axis direction. This allows the capacitance value of the capacitor element CWE for writing/erasing data to be set smaller than the capacitance value of the capacitor element C serving also as the MISFET QR for reading data. As will be explained in an example of a data write operation in the flash memory described later, by setting the capacitance value of the capacitor element CWE smaller than the capacitance value of the capacitor element C, a coupling ratio in writing data and in erasing data can be increased. As a result, data can easily be written/erased.

In Comparative Example 1 described later, such a portion is provided in which the length of a capacitor electrode FGC100 of a capacitor element C100 (see FIG. 14 described later), i.e., the length of the floating gate electrode FG in the X-axis direction is larger than the length of the gate electrode FGR of the MISFET QR for reading data in the X-axis direction. However, in Embodiment 1, such a portion is not provided. In such a case, it is preferable that the gate electrode FGR of the MISFET QR for reading data is the portion of the floating gate electrode FG where the length of the floating gate electrode FG in the X-axis direction is largest.

It is also preferable that a length LNs of the gate electrode FGS of the selection MISFET QS in the X-axis direction is larger than the length LNr of the gate electrode FGR in the X-axis direction. This can prevent or inhibit a punch-through in the selection MISFET QS and reduce a leakage current in an OFF state, i.e., OFF leakage current. On the other hand, in the MISFET QR for reading data, it is less necessary to prevent or inhibit a punch-through than in the selection MISFET QS. Accordingly, the length LNr of the gate electrode FGR in the X-axis direction may also be smaller than the length LNs of the gate electrode FGS in the X-axis direction.

It is also preferable that, at any position between the position where the floating gate electrode FG two-dimensionally overlaps the p-type well HPW1 and the position where the floating gate electrode FG two-dimensionally overlaps the p-type well HPW2, the length of the floating gate electrode FG in the X-axis direction is not less than the length LNwe of the capacitor electrode FGC1 in the X-axis direction. That is, at any position between the capacitor electrode FGC1 and the gate electrode FGR, the length of the floating gate electrode FG in the X-axis direction is not smaller than the length LNr of the capacitor electrode FGC1 in the X-axis direction so that the floating gate electrode FG does not have a constricted shape. This can reduce the electric resistance of the portion of the floating gate electrode FG which is located between the capacitor electrode FGC1 and the gate electrode FGR. Therefore, it is possible to prevent or inhibit a loss resulting from the occurrence of a voltage drop between the capacitor electrode FGC1 and the gate electrode FGR or the like.

It is also preferable that a width WDwe of the portion of the capacitor electrode FGC1 which is interposed between the p-type semiconductor region 11 and the n-type semiconductor region 12 in the Y-axis direction is smaller than a width WDr of the portion of the gate electrode FGR which is interposed between the n-type semiconductor regions 13c and 13d in the Y-axis direction. As a result, the width WDr of the gate electrode FGR in the Y-axis direction relatively increases to allow an increase in the read current flowing in the MISFET QR for reading data and allow for high-speed reading.

<Example of Data Write Operation>

Figure 4:
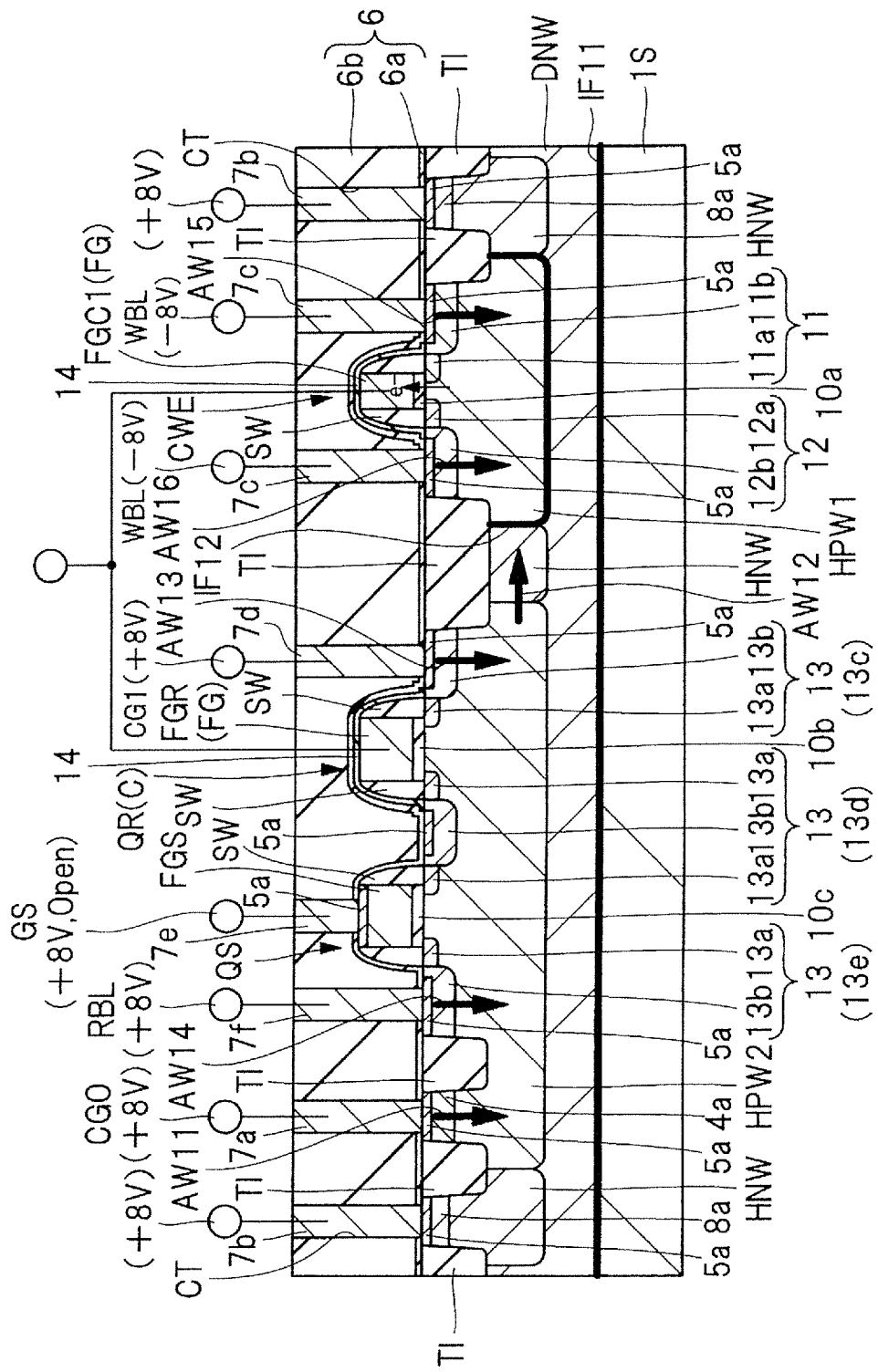
FIG. 4 is a cross-sectional view showing an example of voltages applied to the individual portions of the memory cell in a data write operation in the flash memory in Embodiment 1.

Next, a description will be given of an example of a data write operation in such a flash memory. FIG. 4 is a cross-sectional view showing an example of voltages applied to the individual portions of the memory cell in a data write operation in the flash memory in Embodiment 1. FIG. 4 is a cross-sectional view along the line A-A in FIG. 2.

In writing data, a positive voltage of, e.g., about 8 V is applied to each of the n-type well and the n-type embedded well DNW through each of the conductor portions 7b to electrically isolate the substrate 1S and the p-type wells HPW1 and HPW2 from each other. When the substrate 1S is a p-type silicon single crystal substrate, a reverse bias is applied to a pn junction at an interface IF11 which is the interface between the portion of the substrate 1S underlying the portion thereof formed with the n-type embedded well DNW and the n-type embedded well DNW and shown by the thick line in FIG. 4. In this manner, the substrate 1S and the n-type embedded well DNW are electrically isolated from each other. The electrical isolation provided between the substrate 1S and the n-type embedded well DNW provides electrical isolation between the substrate 1S and the p-type wells HPW1 and HPW2.

Also, a positive voltage of, e.g., about 8 V is applied to each of the p$^+$-type semiconductor region 4a and the p-type well HPW2 through the conductor portion 7a. At this time, since each of the p$^+$-type semiconductor region 4a and the p-type well HPW2 is formed of a p-type semiconductor, as schematically shown by an arrow AW11, the potential difference between the p$^+$-type semiconductor region 4a and the p-type well HPW2 is equal to about 0 V. The arrow AW11 means that the potential difference between the starting end and terminating end of the arrow is equal to about 0 V.

Since a forward bias is applied to a pn junction at the interface between the p-type well HPW2 and the n-type well HNW, as schematically shown by an arrow AW12, the potential difference between the p-type well HPW2 and the n-type well HNW is equal to about 0 V. The arrow AW12 means that the potential difference between the starting end and terminating end of the arrow is equal to about 0 V.

Also, a positive voltage of, e.g., about 8 V is applied from the control gate line CG1 to the n-type semiconductor region 13c as one of the pair of n-type semiconductor regions 13 of the MISFET QR for reading data through the conductor portion 7d. At this time, as schematically shown by an arrow AW13, the potential difference between the n-type semiconductor region 13C coupled to the conductor portion 7d and the p-type well HPW2 is equal to about 0 V. The arrow AW13 means that the potential difference between the starting end and terminating end of the arrow is equal to about 0 V.

Also, a positive voltage of, e.g., about 8 V is applied from the bit line RBL for reading data to the semiconductor region 13e as the other of the pair of n-type semiconductor regions 13 of the selection MISFET QS through the conductor portion 7f. At this time, as schematically shown by an arrow AW14, the potential difference between the n-type semiconductor region 13e coupled to the conductor portion 7f and the p-type well HPW2 is equal to about 0 V. The arrow AW14 means that the potential difference between the starting end and terminating end of the arrow is equal to about 0 V.

Also, a positive voltage of, e.g., about 8 V is applied from the selection line GS to the gate electrode FGS of the selection MISFET QS through the conductor portion 7e or, alternatively, the gate electrode FGS is brought into an open state (shown as "Open" in FIG. 4).

On the other hand, a negative voltage of, e.g., about −8 V is applied from each of the bit lines WBL for writing/erasing data to each of the p-type semiconductor region 11 of the capacitor element CWE for writing/erasing data, the n-type semiconductor region 12 thereof, and the p-type well HPW1 thereof through each of the conductor portions 7c. At this time, since each the p-type semiconductor region and the p-type well HPW1 is formed of a p-type semiconductor, as schematically shown by an arrow AW15, the potential difference between the p-type semiconductor region 11 and the p-type well HPW1 is equal to about 0 V. The arrow AW15 means that the potential difference between the starting end and terminating end of the arrow is equal to about 0 V. Since the potential difference between the p-type semiconductor region 11 and the p-type well HPW1 is equal to about 0 V, as schematically shown by an arrow AW16, the potential difference between the n-type semiconductor region 12 and the p-type well HPW1 is also equal to about 0 V. The arrow AW16 means that the potential difference between the starting end and terminating end of the arrow is equal to about 0 V.

On the other hand, a reverse bias is applied to a pn junction at an interface IF12 which is the interface between the p-type well HPW1 and each of the n-type well HNW and the n-type embedded well DNW and shown by the thick line in FIG. 4 to produce a potential difference of, e.g., about 16 V.

Thus, to each of the n-type embedded well DNW and the p-type well HPW2 forming the lower electrode of the capacitor element C serving also as the MISFET QR for reading data, a positive voltage of, e.g., about 8 V is applied. On the other hand, to the p-type well HPW1 forming the lower electrode of the capacitor element CWE for writing/erasing data, a negative voltage of, e.g., about −8 V, i.e., voltage having the polarity opposite to the polarity of the voltage applied to the p-type well HPW2 is applied via the p-type semiconductor region 11.

By the application of such voltages, the p-type wells HPW1 and HPW2 are individually controlled. As a result, electrons e⁻ are injected as an FN tunnel current from the entire surface of the channel from the p-type well HPW1 into the capacitor electrode FGC1 through the capacitor insulating film 10a or holes are released as an FN tunnel current from the capacitor electrode FGC1. In this manner, data is written.

Note that whether, e.g., electrons or holes are injected or released as an FN tunnel current can be determined on the basis of whether or not the relationship between, e.g., a voltage V and a current I which flows on the application of the voltage V linearly changes in a graph in which the abscissa represents $1/V$ and the ordinate represents $\log (I/V^2)$.

In writing data, the capacitor element C serving also as the MISFET QR for reading data and the capacitor element CWE are coupled in series to each other via the floating gate electrode FG. It is assumed that a capacitance value CAPr is the capacitance value of the capacitor element C and a capacitance value CAPwe is the capacitance value of the capacitor element CWE. It is also assumed that a potential difference Vr is the potential difference between the p-type well HPW2 forming the lower electrode of the capacitor element C and the gate electrode FGR forming the upper electrode of the capacitor element C. It is also assumed that a potential difference Vwe is the potential difference between the p-type well HPW1 forming the lower electrode of the capacitor element CWE and the capacitor electrode FGC1 forming the upper electrode of the capacitor element CWE.

At this time, a ratio RC1 given by the following expression (1), i.e., the ratio of the potential difference Vwe to the total sum of the potential differences Vr and Vwe is defined as the coupling ratio between the capacitor elements C and CWE. As described above, since the capacitor elements C and CWE are coupled in series to each other via the floating gate electrode FG, the coupling ratio RC1 is given by the following expression (2). Accordingly, by increasing the ratio of the capacitance value CAPr to the total sum of the capacitance values CAPr and CAPwe, it is possible to increase the coupling ratio RC1 and increase the potential difference Vwe in the capacitor element CWE. As a result, in the capacitor element CWE, electrons are more likely to be injected as an FN tunnel current into the capacitor electrode FGC1 or holes are more likely to be released as an FN tunnel current from the capacitor electrode FGC1.

$$RC1=Vwe/(Vr+Vwe) \quad (1)$$

$$RC1=CAPr/(CAPr+CAPwe) \quad (2)$$

Preferably, the capacitor elements C and CWE are designed such that the capacitance values CAPr and CAPwe satisfy the following expression (3). By satisfying the foregoing expression (3), as shown in Expressions (2) and (1) shown above, it is possible to set the coupling ratio RC1 larger than 0.5 and set the potential difference Vwe larger than the potential difference Vr. As a result, in the capacitor element CWE, electrons are more likely to be injected as an FN tunnel current into the capacitor electrode FGC1 or holes are more likely to be released as an FN tunnel current from the capacitor electrode FGC1 than in the capacitor element C.

$$CAPr>CAPwe \quad (3)$$

As described above, it is assumed that the length LNr is the length of the gate electrode FGR in the X-axis direction and the width WDr is the width of the gate electrode FGR in the Y-axis direction. It is also assumed that the length LNwe is the length of the capacitor electrode FGC1 in the X-axis direction and the width WDwe is the width of the capacitor electrode FGC1 in the Y-axis direction. At this time, an area Sr occupied by the gate electrode FGR is given by the following expression (4), and an area Swe occupied by the capacitor electrode FGC1 is given by the following expression (5). For example, when the capacitor insulating film 10a and the gate insulating film 10b have equal thicknesses and equal dielectric constants, by satisfying the following expression (6), it is possible to satisfy the foregoing expression (3). That is, when the area occupied by the portion of the capacitor electrode FGC1 which is interposed between the p-type semiconductor region 11 and the n-type semiconductor region 12 is smaller than the area occupied by the portion of the gate electrode FGR which is interposed between the n-type semiconductor regions 13c and 13d, the foregoing expression (3) can be satisfied.

$$Sr=LNr \times WDr \quad (4)$$

$$Swe=LNwe \times WDwe \quad (5)$$

$$Sr>Swe \quad (6)$$

Figure 5:
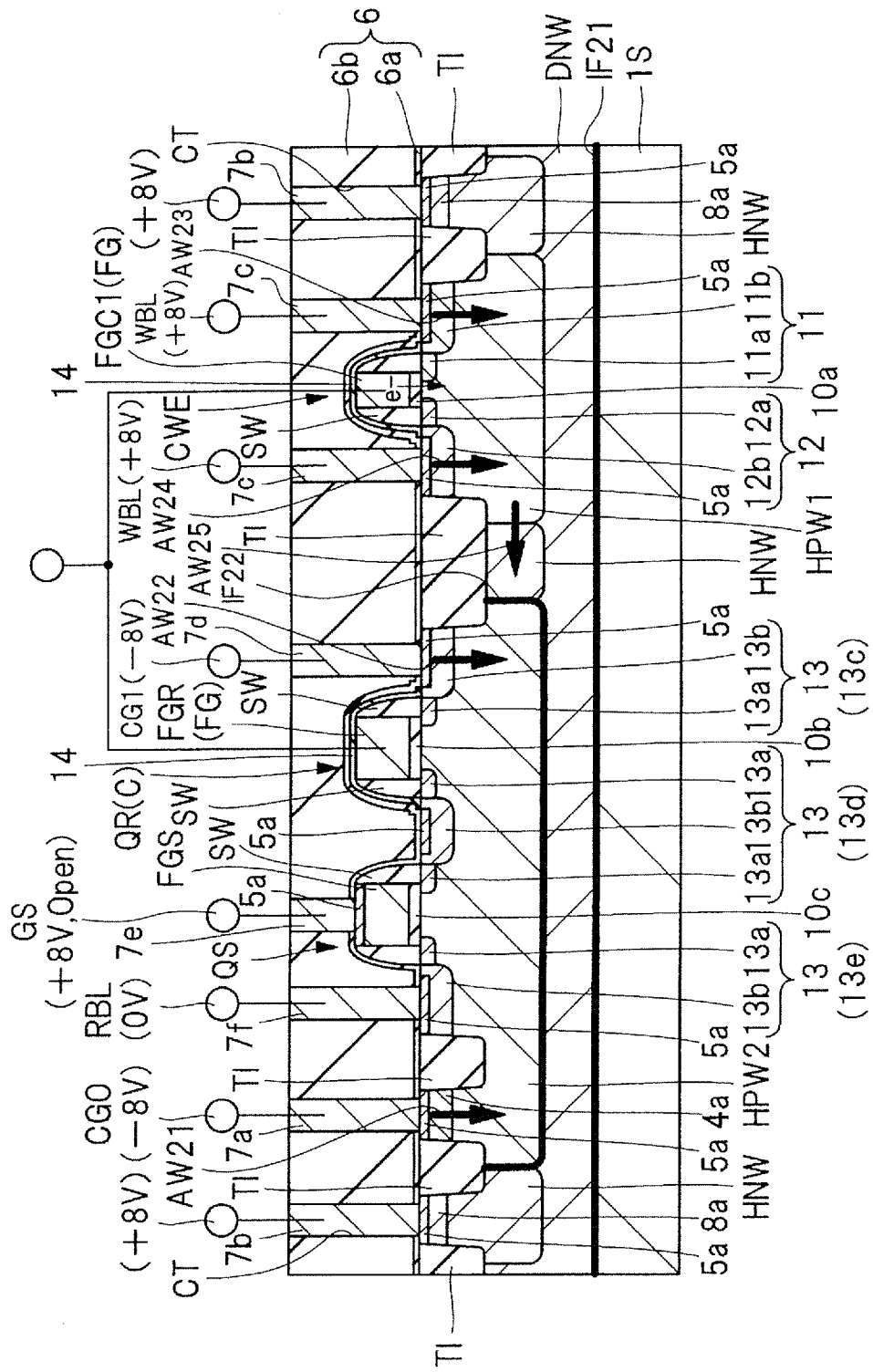
FIG. 5 is a cross-sectional view showing an example of voltages applied to the individual portions of the memory cell in a data erase operation in the flash memory in Embodiment 1.

FIG. 5 is a cross-sectional view showing an example of voltages applied to the individual portions of the memory cell in a data erase operation in the flash memory in Embodiment 1. FIG. 5 is a cross-sectional view along the line A-A in FIG. 2.

In erasing data, a positive voltage of, e.g., about 8 V is applied to each of the n-type well HNW and the n-type embedded well DNW through each of the conductor portions 7b to electrically isolate the substrate 1S and the p-type wells HPW1 and HPW2 from each other. When the substrate 1S is a p-type silicon single crystal substrate, a reverse bias is applied to a pn junction at an interface IF21 which is the interface between the portion of the substrate 1S underlying the portion thereof formed with the n-type embedded well DNW and the n-type embedded well DNW and shown by the thick line in FIG. 5. In this manner, the substrate 1S and the n-type embedded well DNW are electrically isolated from each other. The electrical isolation provided between the substrate 1S and the n-type embedded well DNW provides electrical isolation between the substrate 1S and the p-type wells HPW1 and HPW2.

Also, a negative voltage of, e.g., about −8 V is applied to each of the p⁺-type semiconductor region 4a and the p-type well HPW2 through the conductor portion 7a. At this time, since each of the p⁺-type semiconductor region 4a and the p-type well HPW2 is formed of a p-type semiconductor, as schematically shown by an arrow AW21, the potential difference between the p⁺-type semiconductor region 4a and the p-type well HPW2 is equal to about 0 V. The arrow AW21 means that the potential difference between the starting end and terminating end of the arrow is equal to about 0 V.

Also, a negative voltage of, e.g., about −8 V is applied from the control gate line CG1 to the n-type semiconductor region 13c as one of the pair of n-type semiconductor regions 13 of the MISFET QR for reading data through the conductor portion 7d. At this time, a forward bias is applied to a pn junction at the interface between the n-type semiconductor region 13c coupled to the conductor portion 7d and the p-type well HPW2. Consequently, as schematically shown by an arrow AW22, the potential difference between the n-type semiconductor region 13C coupled to the conductor portion 7d and the p-type well HPW2 is equal to about 0 V. The arrow AW22 means that the potential difference between the starting end and terminating end of the arrow is equal to about 0 V.

Also, e.g., 0 V is applied from the bit line RBL for reading data to the semiconductor region 13e as the other of the pair of n-type semiconductor regions 13 of the selection MISFET QS through the conductor portion 7f. At this time, a reverse bias is applied to a pn junction at the interface between the n-type semiconductor region 13e coupled to the conductor portion 7f and the p-type well HPW2. Consequently, the potential difference between the n-type semiconductor region 13e coupled to the conductor portion 7f and the p-type well HPW2 is equal to about 8 V.

Also, a positive voltage of, e.g., about 8 V is applied from the selection line GS to the gate electrode FGS of the selection MISFET QS through the conductor portion 7e or, alternatively, the gate electrode FGS is brought into the open state (shown as "Open" in FIG. 5).

On the other hand, a positive voltage of, e.g., about 8 V is applied from each of the bit lines WBL for writing/erasing data to each of the p-type semiconductor region 11 of the capacitor element CWE for writing/erasing data, the n-type semiconductor region 12 thereof, and the p-type well HPW1 thereof through each of the conductor portions 7c. At this time, since each of the p-type semiconductor region 11 and the p-type well HPW1 is formed of a p-type semiconductor, as schematically shown by an arrow AW23, the potential difference between the p-type semiconductor region 11 and the p-type well HPW1 is equal to about 0 V. The arrow AW23 means that the potential difference between the starting end and terminating end of the arrow is equal to about 0 V. Since the potential difference between the p-type semiconductor region 11 and the p-type well HPW1 is equal to about 0 V, as schematically shown by an arrow AW24, the potential difference between the n-type semiconductor region 12 and the p-type well HPW1 is also equal to about 0 V. The arrow AW24 means that the potential difference between the starting end and terminating end of the arrow is equal to about 0 V.

Since a forward bias is applied to a pn junction at the interface between the p-type well HPW1 and the n-type well HNW, as schematically shown by an arrow AW25, the potential difference between the p-type well HPW1 and the n-type well HNW is equal to about 0 V. The arrow AW25 means that the potential difference between the starting end and terminating end of the arrow is equal to about 0 V.

On the other hand, a reverse bias is applied to a pn junction at an interface IF22 which is the interface between the p-type well HPW2 and each of the n-type well HNW and the n-type embedded well DNW and shown by the thick line in FIG. 5 to produce a potential difference of, e.g., about 16 V.

Thus, to the n-type embedded well DNW, the voltage having the same polarity as that of the voltage applied to the n-type embedded well DNW in writing data is applied. On the other hand, to the p-type well HPW2 forming the lower electrode of the capacitor element C serving also as the MISFET QR for reading data, a negative voltage of, e.g., about −8 V, i.e., voltage having the polarity opposite to the polarity of the voltage applied to the n-type embedded well DNW in writing data is applied. To the p-type well HPW1 forming the lower electrode of the capacitor element CWE for writing/erasing data, a positive voltage of about 8 V, i.e., voltage having the same polarity as that of the voltage applied to the n-type embedded well DNW in writing data is applied. Note that, to the p-type well HPW1, the same voltage as the voltage applied to the n-type embedded well DNW may also be applied.

By the application of such voltages, the p-type wells HPW1 and HPW2 are individually controlled. As a result, the electrons e⁻ stored in the floating gate electrode FG serving as the capacitor electrode FGC1 are released as an FN tunnel current into the p-type well HPW1 through the capacitor insulating film 10a or holes are injected as an FN tunnel current into the capacitor electrode FGC1. In this manner, data is erased.

The coupling ratio in erasing data is the same as the coupling ratio RC1 in writing data, i.e., the coupling ratio RC1 shown in the foregoing expression (2). Accordingly, in erasing data also, in the same manner as in writing data, by increasing the ratio of the capacitance value CAPr to the total sum of the capacitance values CPr and CAPwe, it is possible to increase the coupling ratio RC1 shown in the foregoing expression (2) and increase the potential difference Vwe in the capacitor element CWE. As a result, in the capacitor element CWE, electrons are more likely to be released as an FN tunnel current from the capacitor electrode FGC1 or holes are more likely to be injected as an FN tunnel current into the capacitor electrode EGC1.

Preferably, by satisfying the foregoing expression (3), the coupling ratio RC1 can be set larger than 0.5 and the potential difference Vwe can be set larger than the potential difference Vr. As a result, in the capacitor element CWE, electrons are more likely to be released as an FN tunnel current from the capacitor electrode FGC1 or holes are more likely to be injected as an FN tunnel current into the capacitor electrode FGC1 than in the capacitor element C.

Figure 6:
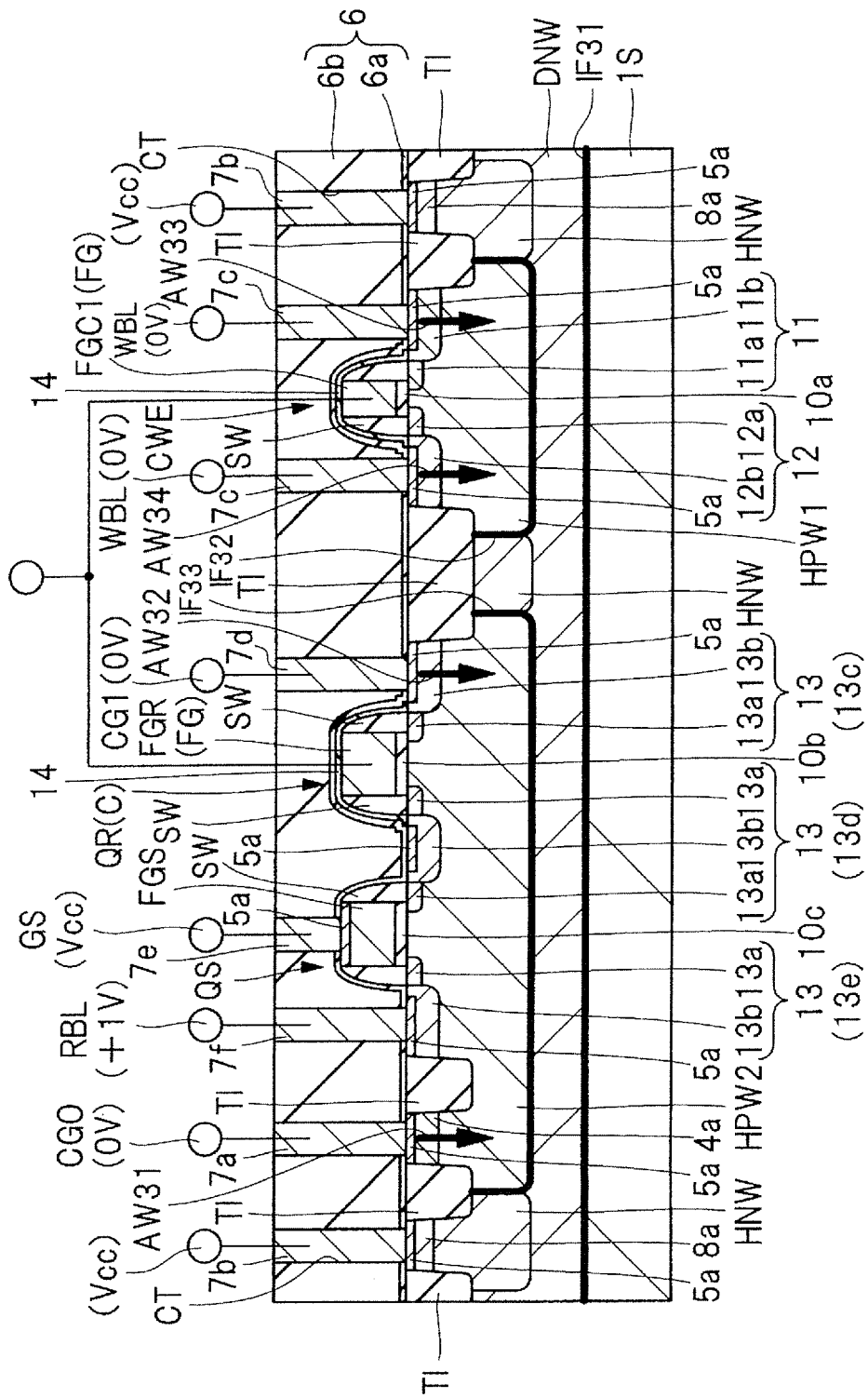
FIG. 6 is a cross-sectional view showing an example of voltages applied to the individual portions of the memory cell in a data read operation in the flash memory in Embodiment 1.

FIG. 6 is a cross-sectional view showing an example of voltages applied to the individual portions of the memory cell in a data read operation in the flash memory in Embodiment 1. FIG. 6 is a cross-sectional view along the line A-A in FIG. 2.

In reading data, a voltage of, e.g., about 3 V as a power supply voltage Vcc is applied to each of to the n-type well HNW and the n-type embedded well DNW to electrically isolate the substrate 1S and the p-type wells HPW1 and HPW2 from each other. When the substrate 1S is a p-type silicon single crystal substrate, a reverse bias is applied to a pn junction at an interface IF31 which is the interface between the portion of the substrate 1S underlying the portion thereof formed with the n-type embedded well DNW and the n-type embedded well DNW and shown by the thick line in FIG. 6. In this manner, the substrate 1S and the n-type embedded well DNW are electrically isolated from each other. The electrical isolation provided between the substrate 1S and the n-type embedded well DNW provides electrical isolation between the substrate 1S and the p-type wells HPW1 and HPW2.

Also, a voltage of, e.g., 0 V is applied to each of the p⁺-type semiconductor region 4a and the p-type well HPW2 through the conductor portion 7a. At this time, since each of the p⁺-type semiconductor region 4a and the p-type well HPW2 is formed of a p-type semiconductor, as schematically shown by an arrow AW31, the potential difference between the p⁺-type semiconductor region 4a and the p-type well HPW2 is equal to about 0 V. The arrow AW31 means that the potential difference between the starting end and terminating end of the arrow is equal to about 0 V.

Also, a voltage of, e.g., about 0 V is applied from the control gate line CG1 to the n-type semiconductor region 13c as one of the pair of n-type semiconductor regions 13 of the MISFET QR for reading data through the conductor portion 7d. At this time, as schematically shown by an arrow AW32, the potential difference between the n-type semiconductor region 13C coupled to the conductor portion 7d and the p-type well HPW2 is equal to about 0 V. The arrow AW32 means that the potential difference between the starting end and terminating end of the arrow is equal to about 0 V.

Also, a positive voltage of, e.g., about 1 V is applied from the bit line RBL for reading data to the semiconductor region 13e as the other of the pair of n-type semiconductor regions 13 of the selection MISFET QS through the conductor portion 7f.

Also, a voltage of, e.g., about 3 V as the power supply voltage Vcc is applied from the selection line GS to the gate electrode FGS of the selection MISFET QS through the conductor portion 7e.

On the other hand, a voltage of, e.g., 0 V is applied from each of the bit lines WBL for writing/erasing data to each of the p-type semiconductor region 11 of the capacitor element CWE for writing/erasing data, the n-type semiconductor region 12 thereof, and the p-type well HPW1 thereof through each of the conductor portions 7c. At this time, since each of the p-type semiconductor region 11 and the p-type well HPW1 is formed of a p-type semiconductor, as schematically shown by an arrow AW33, the potential difference between the p-type semiconductor region 11 and the p-type well HPW1 is equal to about 0 V. The arrow AW33 means that the potential difference between the starting end and terminating end of the arrow is equal to about 0 V. Since the potential difference between the p-type semiconductor region 11 and the p-type well HPW1 is equal to about 0 V, as schematically shown by an arrow AW34, the potential difference between the n-type semiconductor region 12 and the p-type well HPW1 is also equal to about 0 V. The arrow AW34 means that the potential difference between the starting end and terminating end of the arrow is equal to about 0 V.

Note that each of the voltages applied to the p-type semiconductor region 11 of the capacitor element CWE for writing/erasing data, the n-type semiconductor region 12 thereof, and the p-type well HPW1 thereof may also be, e.g., the power supply voltage Vcc instead of 0 V. Alternatively, each of the foregoing voltages can also be applied in accordance with a sweep method which continuously changes the applied voltage from a given voltage value to another voltage value.

On the other hand, a reverse bias is applied to a pn junction at an interface IF32 which is the interface between the p-type well HPW1 and each of the n-type well HNW and the n-type embedded well DNW and shown by the thick line in FIG. 6 to produce a potential difference corresponding to, e.g., the power supply voltage Vcc. Additionally, a reverse bias is applied to a pn junction at an interface IF33 which is the interface between the p-type well HPW2 and each of the n-type well HNW and the n-type embedded well DNW and shown by the thick line in FIG. 6 to produce a potential difference corresponding to, e.g., the power supply voltage Vcc.

Thus, to the n-type embedded well DNW, e.g., the power supply voltage Vcc is applied. Also, in the state where a voltage of, e.g., 0 V is applied to the p-type well HPW2 forming the lower electrode of the capacitor element C serving also as the MISFET QR for reading data and a voltage of, e.g., 0 V is applied to the p-type well HPW1 forming the lower electrode of the capacitor element CWE for writing/erasing data, the selection MISFET QS is brought into an ON state. In such a state, the data stored in the selected memory cell, which is either 0 or 1 depending on whether or not a drain current flows in the channel of the MISFET QR for reading data, is read. That is, on the basis of the value of the current flowing between the semiconductor region 13c as one of the pair of n-type semiconductor regions of the MISFET QR for reading data and the n-type semiconductor region 13d as the other of the pair of n-type semiconductor regions 13 thereof, the data stored in the memory cell MCi is read.

Note that, in reading data, a ratio RC2 shown in the following expression (7), i.e., the ratio of the potential difference Vr to the total sum of the potential differences Vr and Vwe is defined as the coupling ratio between the capacitor elements C and CWE.

$$RC2 = Vr/(Vr+Vwe) \tag{7}$$

According to Embodiment 1 as described above, the capacitor element CWE for writing/erasing data and the MISFET QR for reading data are respectively formed in the p-type wells HPW1 and HPW2, which are separate from each other, and isolated from each other by the n-type well HNW and the n-type embedded well DNW. Also, rewriting of data is performed in the capacitor element CWE for writing/erasing data. This eliminates the need to provide the memory cell MC1 of the flash memory with the capacitor element C100 (see FIG. 14 described later) described in Comparative Example 1 described later and allows a reduction in the size of the semiconductor device.

Since the capacitor element CWE for writing/erasing data and the MISFET QR for reading data are formed respectively in the p-type wells HPW1 and HPW2, which are separate from each other, rewriting of data can be stabilized. This can improve the reliability of the operation of the flash memory.

In addition, since the rewriting of data can be performed with an FN tunnel current from the entire surface of the channel which consumes minimum power and is appropriate for single power supply rewriting at a low voltage, it is easy to provide a single power supply configuration using an internal boosting circuit. This can increase the number of times data can be rewritten.

<Manufacturing Method of Semiconductor Device>

Next, a description will be given of a manufacturing method of the semiconductor device in Embodiment 1. FIGS. 7 to 12 are main-portion cross-sectional views of the semiconductor device in Embodiment 1 during a manufacturing process thereof. FIGS. 7 to 12 are cross-sectional views along the line A-A of FIG. 2.

Figure 7:
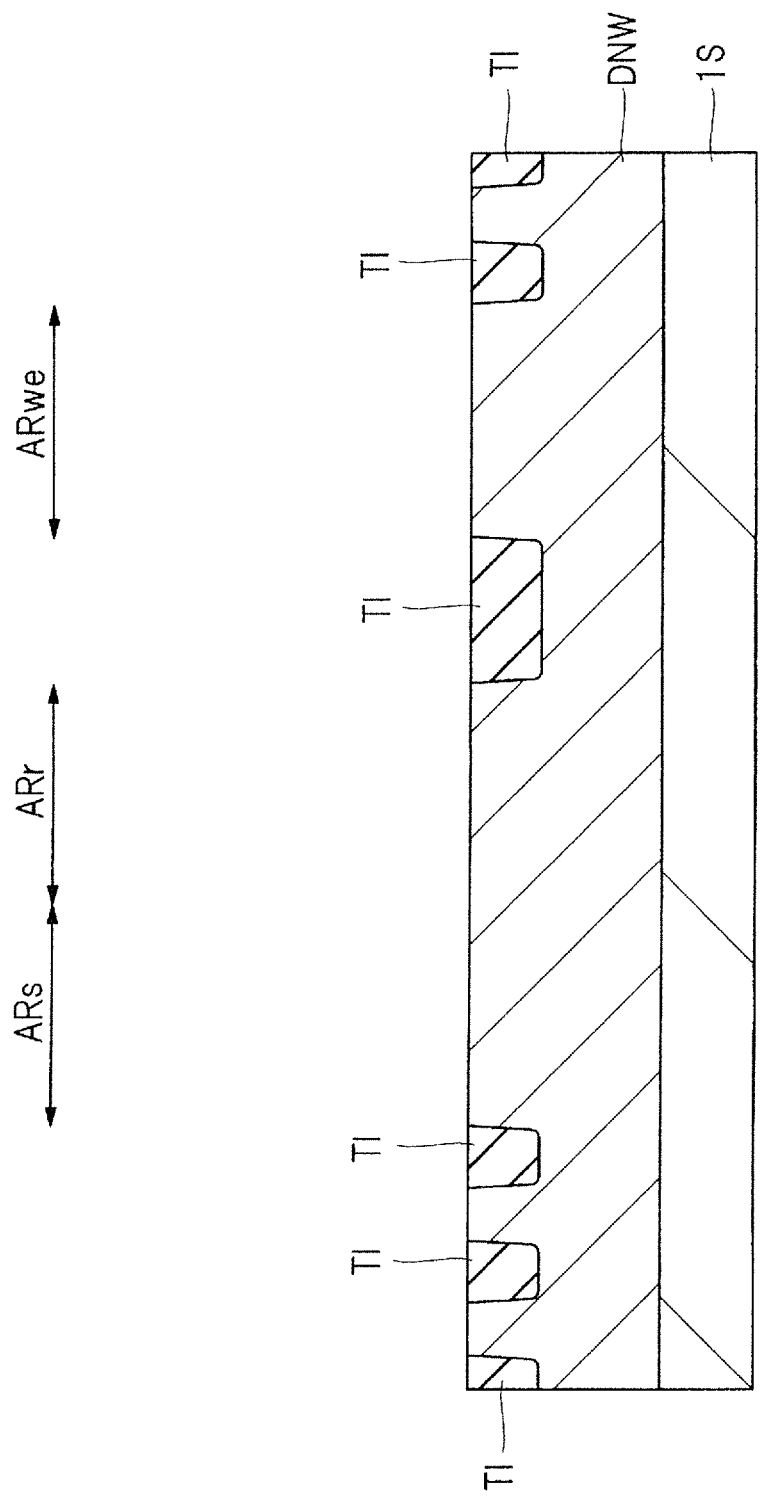
FIG. 7 is a main-portion cross-sectional view of the semiconductor device in Embodiment 1 during a manufacturing process thereof.

First, as shown in FIG. 7, the substrate 1S as a semiconductor substrate made of a silicon (Si) single crystal having a p-type conductivity type is provided. On the main surface side of the substrate 1S, the n-type embedded well DNW is formed by a photolithographic (hereinafter referred to simply as lithographic) process, an ion implantation process, and the like. The lithographic process is a sequence of steps of forming an intended resist pattern through the application of a photoresist (hereinafter referred to simply as resist) film, the exposure thereof to light, the development thereof, and the like. In the ion implantation process, using a resist pattern formed over the main surface of the substrate 1S through the lithographic process as a mask, an intended impurity is selectively introduced into the intended portion of the substrate 1S. The resist pattern is formed herein as such a pattern as to expose the region in which the impurity has been introduced and cover the other region.

Subsequently, isolation trenches are formed in the isolation regions of the main surface of the substrate 1S. Then, in the isolation trenches, an insulating film is embedded to form the trench-shaped isolation portions TI. In this manner, active regions are defined in an area ARwe where the capacitor element CWE for writing/erasing data is to be formed, an area ARr in which the MISFET QR for reading data is to be formed, and an area ARs in which the selection MISFET QS is to be formed. It may also be possible to form the isolation portions TI first and then form the n-type embedded well DNW.

Figure 8:
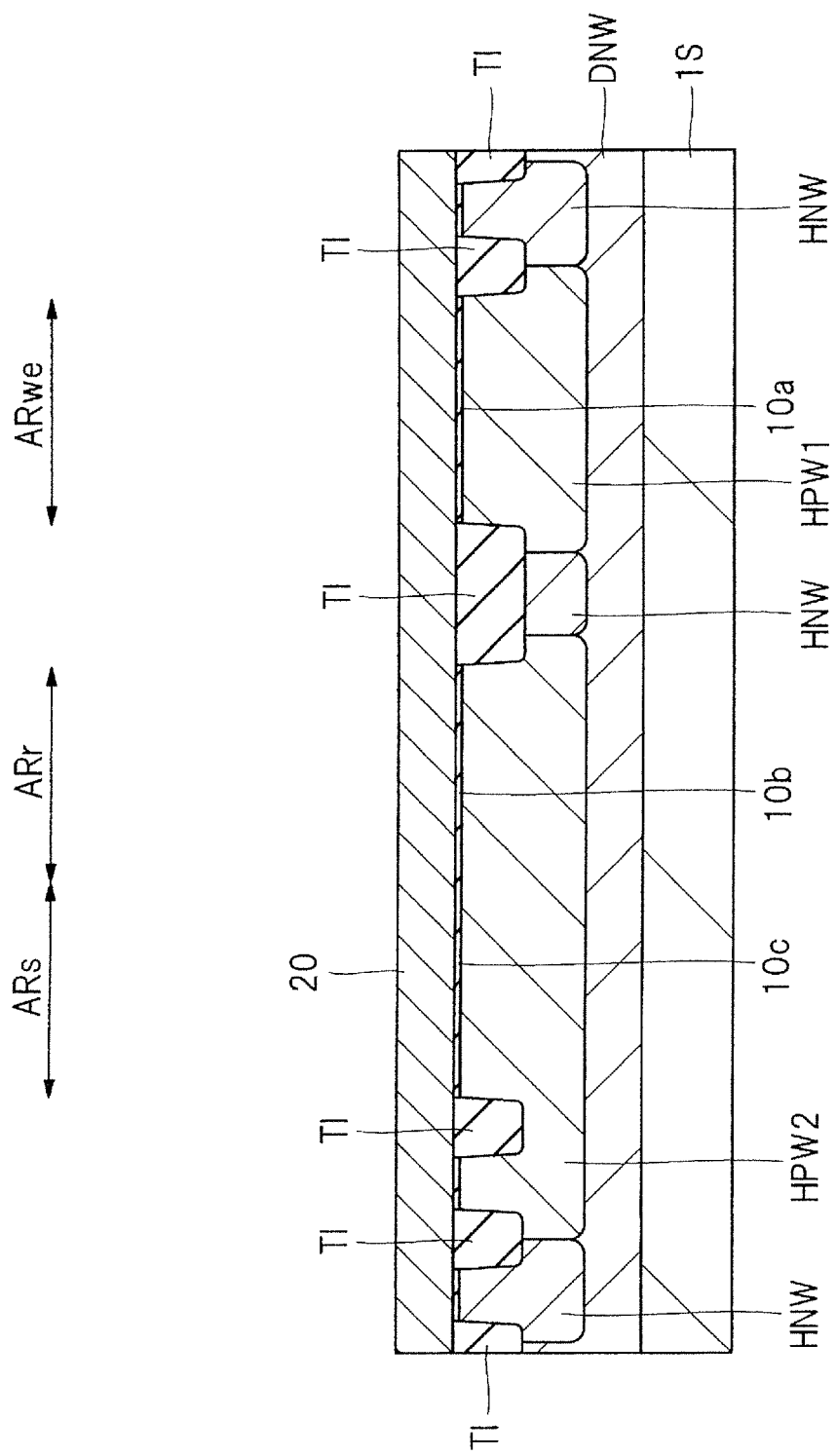
FIG. 8 is a main-portion cross-sectional view of the semiconductor device in Embodiment 1 during the manufacturing process thereof.

Next, as shown in FIG. 8, the p-type wells HPW1 and HPW2 and the n-type well HNW are formed by a lithographic process, an ion implantation process, and the like. From the main surface side of the substrate 1S, into the n-type embedded well DNW, a p-type impurity such as, e.g., boron (B) is ion-implanted by an ion implantation method to form the p-type wells HPW1 and HPW2. Also, from the main surface side of the substrate 1S, into the n-type embedded well DNW, an n-type impurity such as, e.g., phosphorus (P) or arsenic (As) is implanted by an ion implantation method to form the n-type well HNW.

Subsequently, the capacitor insulating film $10a$ and the gate insulating films $10b$ and $10c$ are formed by a thermal oxidation method or the like. The capacitor insulating film $10a$ is formed in the area ARwe where the capacitor element CWE for writing/erasing data is to be formed. The gate insulating film $10b$ is formed in the area ARr where the MISFET QR for reading data is to be formed. The gate insulating film $10c$ is formed in the area ARs where the selection MISFET QS is to be formed. The capacitor insulating film $10a$ and the gate insulating films $10b$ and $10c$ can also be formed by a CVD method or the like instead of the thermal oxidation method described above. As described above, it is preferable that each of the capacitor insulating film $10a$ and the gate insulating films $10b$ and $10c$ preferably has a thickness of not less than 10 nm and not more than 20 nm which is, e.g., 12 nm.

Thereafter, over the main surface of the substrate 1S, a conductor film 20 made of, e.g., low-resistance polysilicon is formed by a CVD method or the like.

Figure 9:
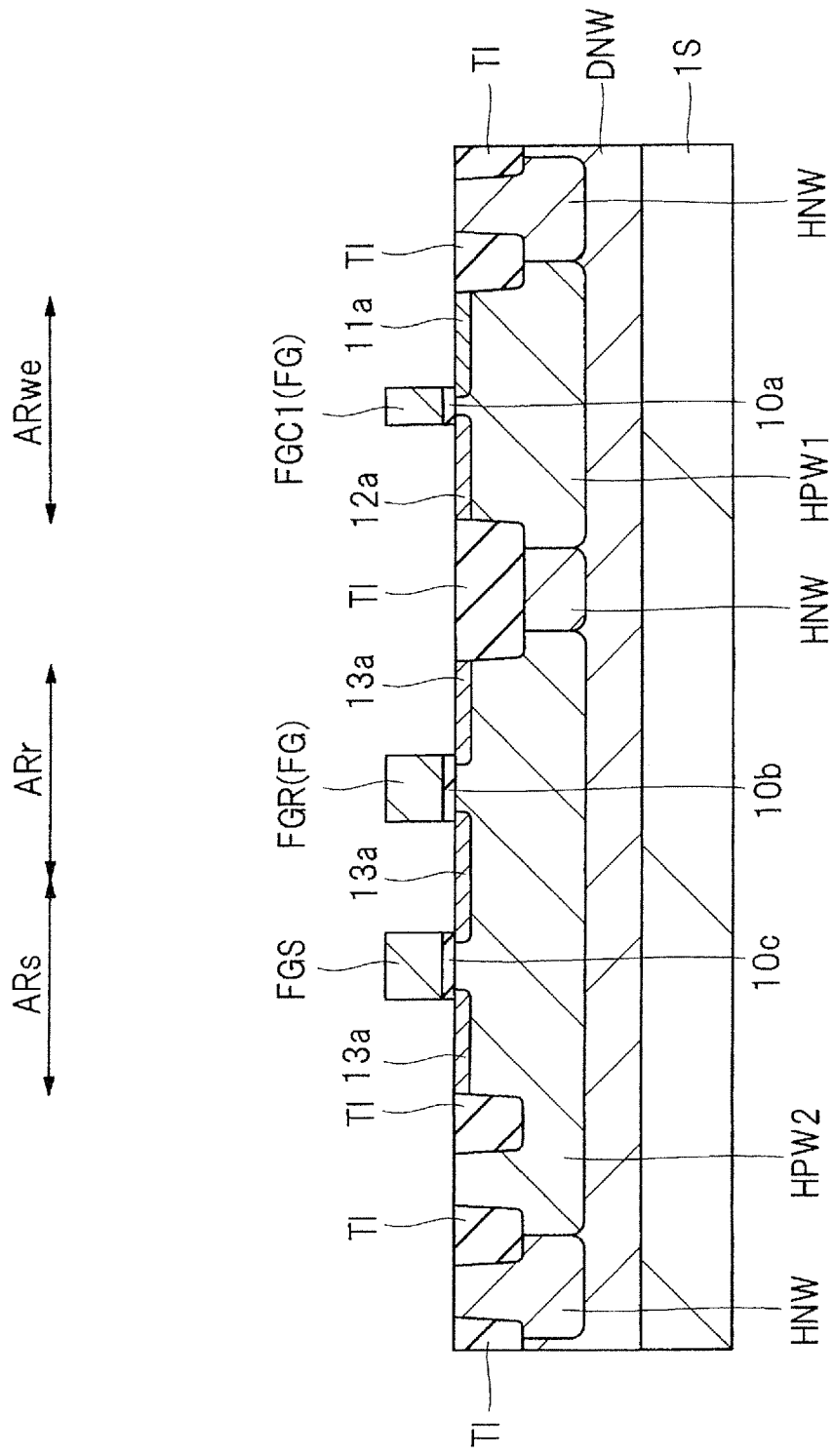
FIG. 9 is a main-portion cross-sectional view of the semiconductor device in Embodiment 1 during the manufacturing process thereof.

Then, as shown in FIG. 9, the conductor film 20 is patterned by, e.g., a lithographic process and an etching process to form the capacitor electrode FGC1 as the floating gate electrode FG, the gate electrode FGR as the floating gate electrode FG, and the gate electrode FGS. The capacitor electrode FGC1 is formed in the area ARwe where the capacitor element CWE for writing/erasing data is to be formed. The gate electrode FGR is formed in the area ARr where the MISFET QR for reading data is to be formed. The gate electrode FGS is formed in the area ARs where the selection MISFET QS is to be formed.

Subsequently, in the area ARwe where the capacitor element CWE for writing/erasing data is to be formed, in the portion of the p-type well HPW1 which is located on one side of the capacitor electrode FGC1, the $p^-$-type semiconductor region $11a$ is formed by a lithographic process, an ion implantation method, and the like. Subsequently, in the area ARwe where the capacitor element CWE for writing/erasing data is to be formed, in the portion of the p-type well HPW1 which is located on the other side of the capacitor electrode FGC1, the $n^-$-type semiconductor region $12a$ is formed by a lithographic process, an ion implantation method, and the like. On the other hand, in the area ARr where the MISFET QR for reading data is to be formed, the $n^-$-type semiconductor regions $13a$ are formed by a lithographic process, an ion implantation method, and the like. In the area ARs where the selection MISFET QS is to be formed, the $n^-$-type semiconductor regions $13a$ are formed by a lithographic process, an ion implantation method, and the like.

Figure 10:
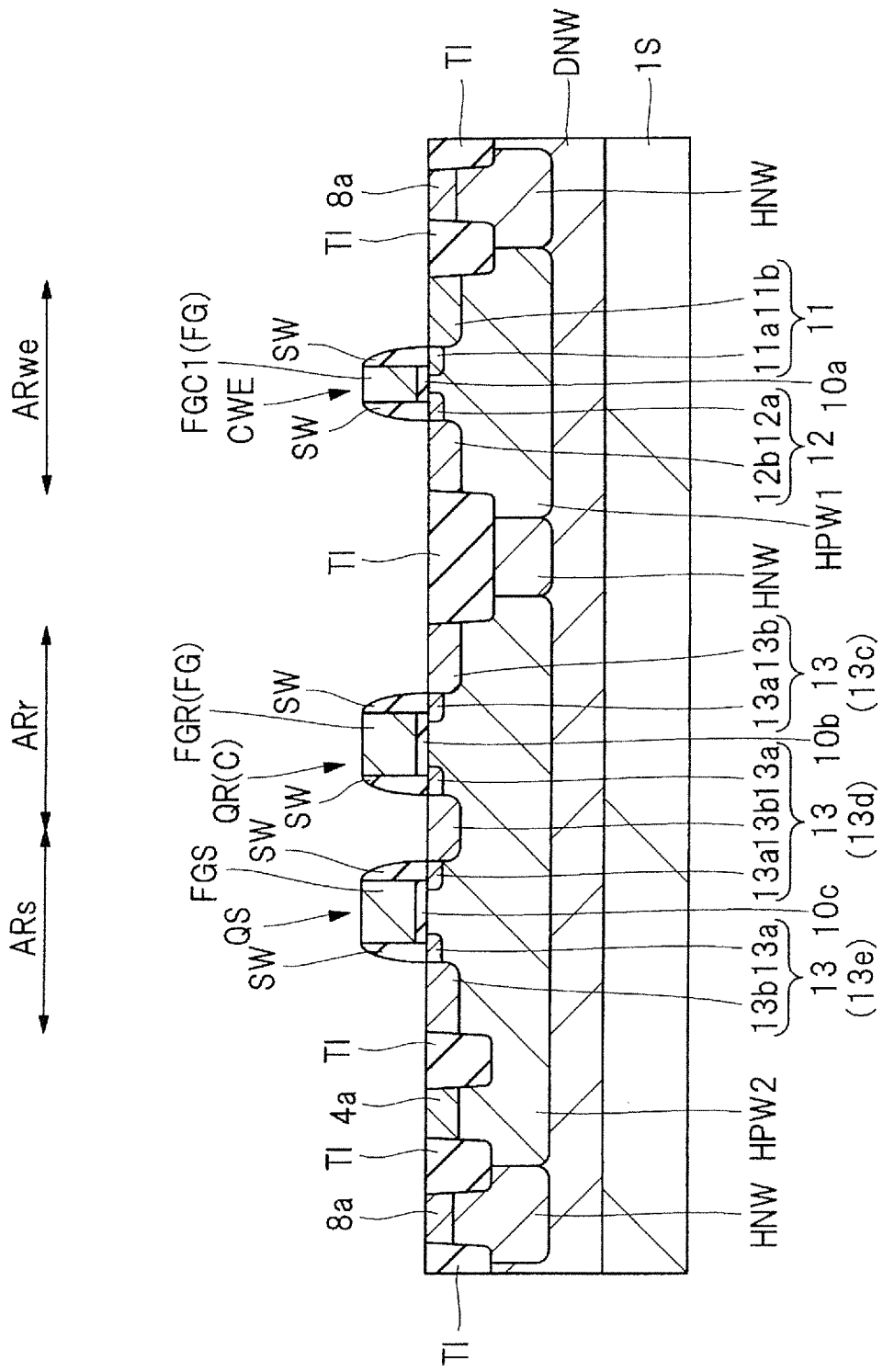
FIG. 10 is a main-portion cross-sectional view of the semiconductor device in Embodiment 1 during the manufacturing process thereof.

Next, as shown in FIG. 10, over the main surface of the substrate 1S, an insulating film made of, e.g., silicon dioxide is deposited by a CVD method or the like and then etched back by anisotropic dry etching to form the sidewalls SW over the side surfaces of the capacitor electrode FGC1 and the gate electrodes FGR and FGS.

Subsequently, in the area ARwe where the writing/erasing capacitor element CWE is to be formed, in the portion of the p-type well HPW1 which is located on one side of the capacitor electrode FGC1 formed with the sidewalls SW, the $p^+$-type semiconductor region $11b$ is formed by a lithographic process, an ion implantation method, and the like. At this time, into, e.g., a region IPP1 (see FIG. 2), a p-type impurity such as, e.g., boron (B) is implanted by an ion implantation method. As a result, in the area ARwe, the $p^+$-type semiconductor region $11b$ is formed in the portion of the p-type well HPW1 which is located on one side of the capacitor electrode FGC1 having the sidewalls SW formed over the side surfaces thereof, resulting in the formation of the p-type semiconductor region 11 including the $p^-$-type semiconductor region $11a$ and the $p^+$-type semiconductor region $11b$. Also, in the extension region of the p-type well HPW2, the $p^+$-type semiconductor region $4a$ is formed by a lithographic step, an ion implantation method, and the like. At this time, a p-type impurity such as, e.g., boron (B) is implanted into, e.g., a region IPP2 (see FIG. 2) by an ion implantation method.

Subsequently, in the area ARwe where the writing/erasing capacitor element CWE is to be formed, the $n^+$-type semiconductor region $12b$ is formed by a lithographic step, an ion implantation method, and the like. At this time, an n-type impurity such as, e.g., phosphorus (P) or arsenic (As) is implanted into, e.g., a region IPN1 (see FIG. 2) by an ion implantation method. As a result, in the area ARwe, in the portion of the p-type well HPW1 which is located on the other side of the capacitor electrode FGC1 having the sidewalls SW formed over the side surfaces thereof, the $n^+$-type semiconductor region $12b$ is formed, resulting in the formation of the n-type semiconductor region 12 including the $n^-$-type semiconductor region $12a$ and the $n^+$-type semiconductor region $12b$. Also, in the area ARwe where the capacitor element CWE for writing/erasing data is to be formed, the capacitor element CWE for writing/erasing data is formed.

In the area ARr where the MISFET QR for reading data is to be formed and in the area ARs where the selection MISFET QS is to be formed, the $n^+$-type semiconductor regions $13b$ are formed by a lithographic step, an ion implantation method, and the like. At this time, an n-type impurity such as, e.g., phosphorus (P) or arsenic (As) is implanted into, e.g., a region IPN2 (see FIG. 2) by an ion implantation method. As a result, in the area ARr where the MISFET QR for reading data is to be formed and in the area ARs where the selection MISFET QS is to be formed, the $n^+$-type semiconductor regions $13b$ are formed, resulting in the formation of the n-type semiconductor regions 13 including the $n^-$-type semiconductor regions $13a$ and the $n^+$-type semiconductor regions $13b$. Consequently, in the area ARr where the MISFET QR for reading data is to be formed, the MISFET QR for reading data is formed while, in the area ARs where the selection MISFET QS is to be formed, the selection MISFET QS is formed. The pair of n-type semiconductor regions 13 of the MISFET QR for reading data are the n-type semiconductor regions $13c$ and $13d$. The pair of n-type semiconductor regions 13 of the selection MISFET QS are the n-type semiconductor regions $13d$ and $13e$. At this time, in parts of the layer located over the n-type well HNW, the $n^+$-type semiconductor regions $8a$ are formed.

Figure 11:
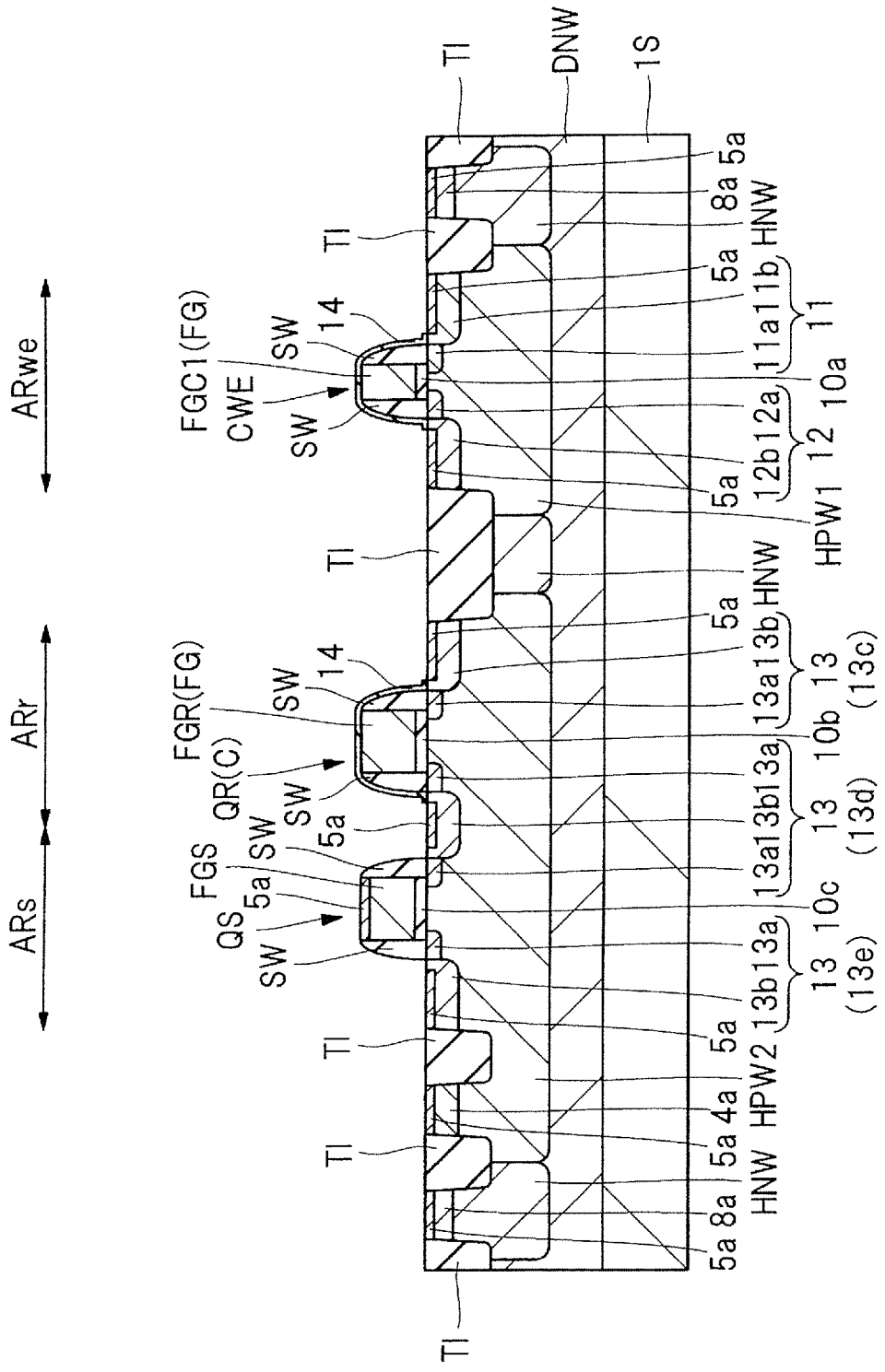
FIG. 11 is a main-portion cross-sectional view of the semiconductor device in Embodiment 1 during the manufacturing process thereof.

Next, as shown in FIG. 11, the silicide layers $5a$ are selectively formed. Prior to the step of forming the silicide layers $5a$, over the upper surface of the floating gate electrode FG including the capacitor electrode FGC1 and the gate electrode FGR, the cap insulating film 14 is formed while, over a part of the substrate 1S, an insulating film is formed to prevent the silicide layer 5a from being formed in the portion.

Figure 12:
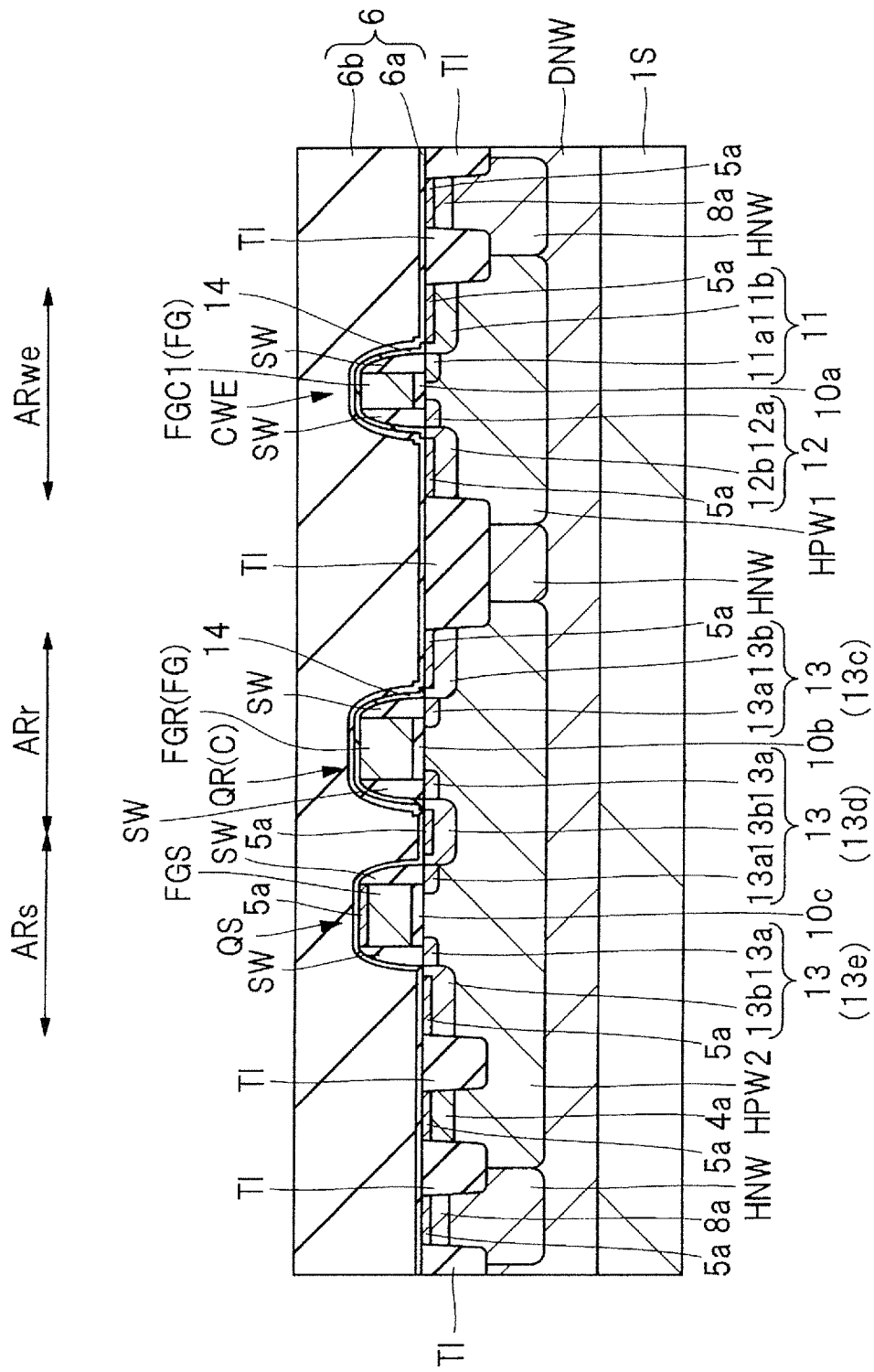
FIG. 12 is a main-portion cross-sectional view of the semiconductor device in Embodiment 1 during the manufacturing process thereof.

Next, as shown in FIG. 12, over the main surface of the substrate 1S, the insulating film 6a made of, e.g., silicon nitride is deposited by a CVD method or the like. Then, over the insulating film 6a, the insulating film 6b made of, e.g., silicon dioxide is deposited to be thicker than the insulating film 6a by a CVD method or the like. The insulating film 6b is further subjected to a chemical mechanical polishing (CMP) process to have the upper surface thereof planarized. In this manner, the insulating film 6 including the insulating films 6a and 6b is formed.

Next, as shown in FIG. 3, in the insulating film 6, the contact holes CT are formed by a lithographic process and an etching process. Then, over the main surface of the substrate 1S, a conductor film made of, e.g., tungsten (W) or the like is deposited by a CVD method or the like and subsequently polished by a CMP method or the like to form the conductor portions 7a to 7f in the contact holes CT. Thereafter, a typical interconnect forming process, an inspection process, and an assembly process are performed to manufacture the semiconductor device.

<About Area Occupied by Memory Cell>

Next, a description will be given of the area occupied by a memory cell in Comparative Example 1 in which a MISFET for reading data and a capacitor element are separately provided.

Figure 13:
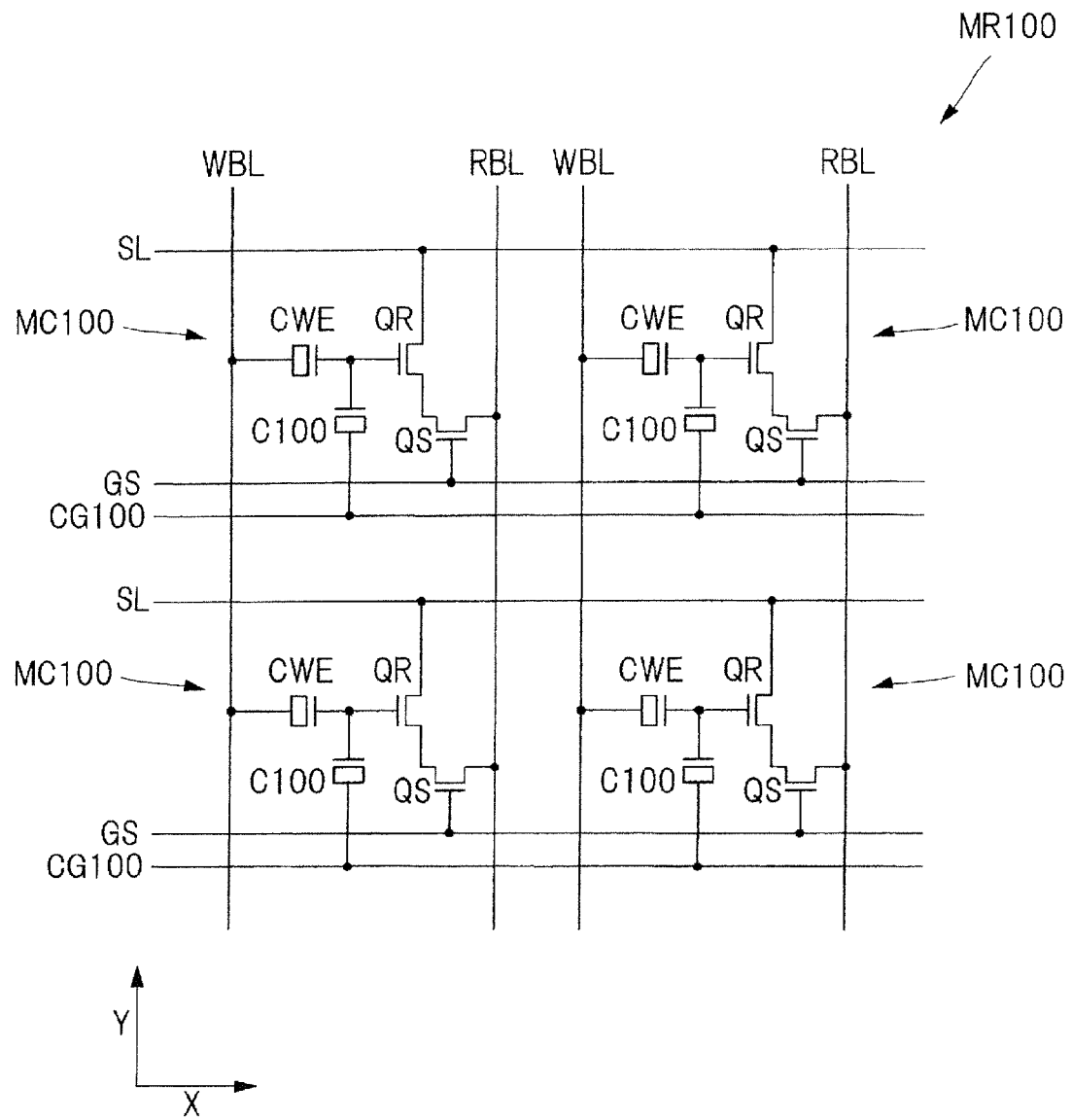
FIG. 13 is a main-portion circuit diagram of a flash memory in a semiconductor device in Comparative Example 1.
Figure 14:
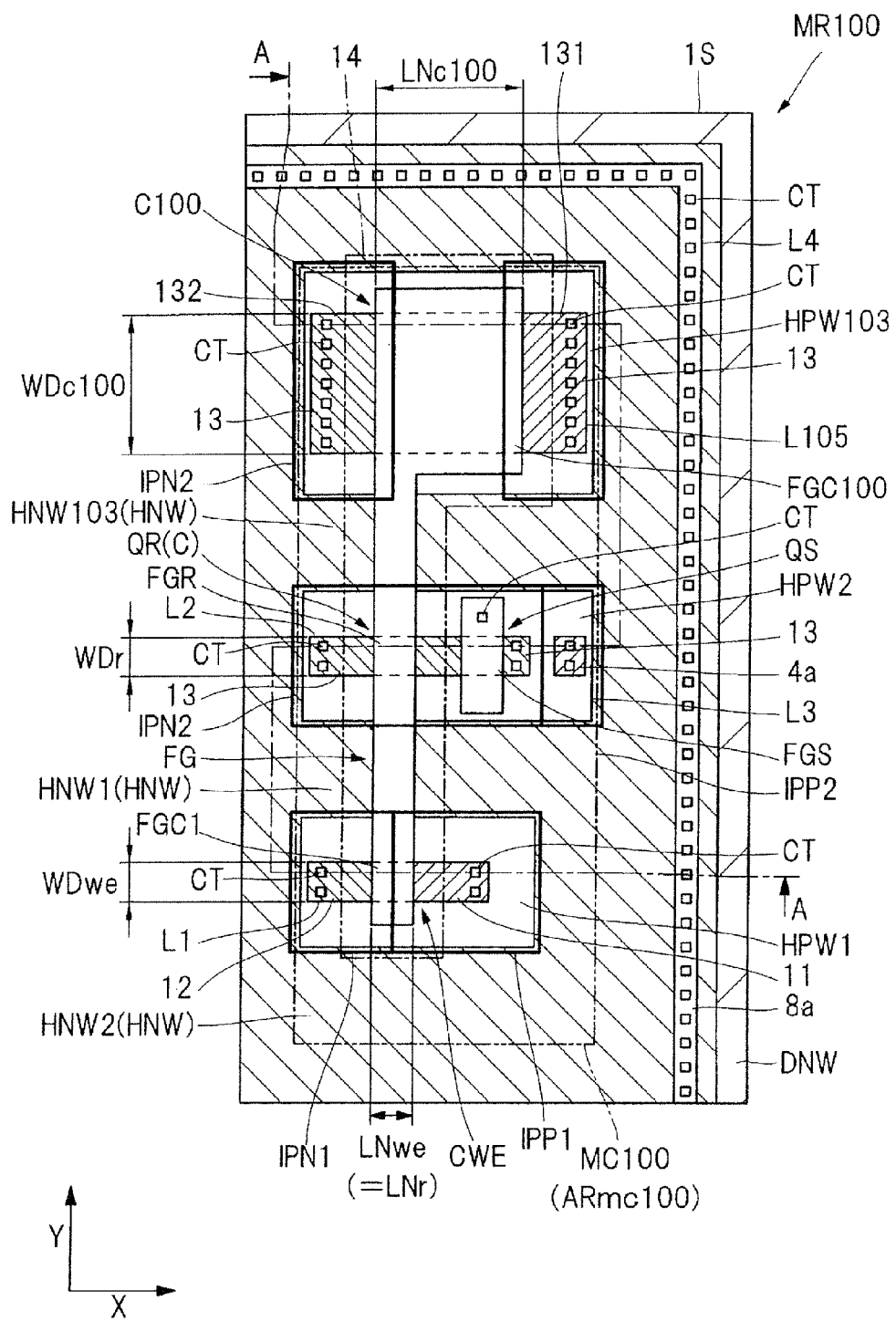
FIG. 14 is a plan view of each of memory cells in the semiconductor device in Comparative Example 1.
Figure 15:
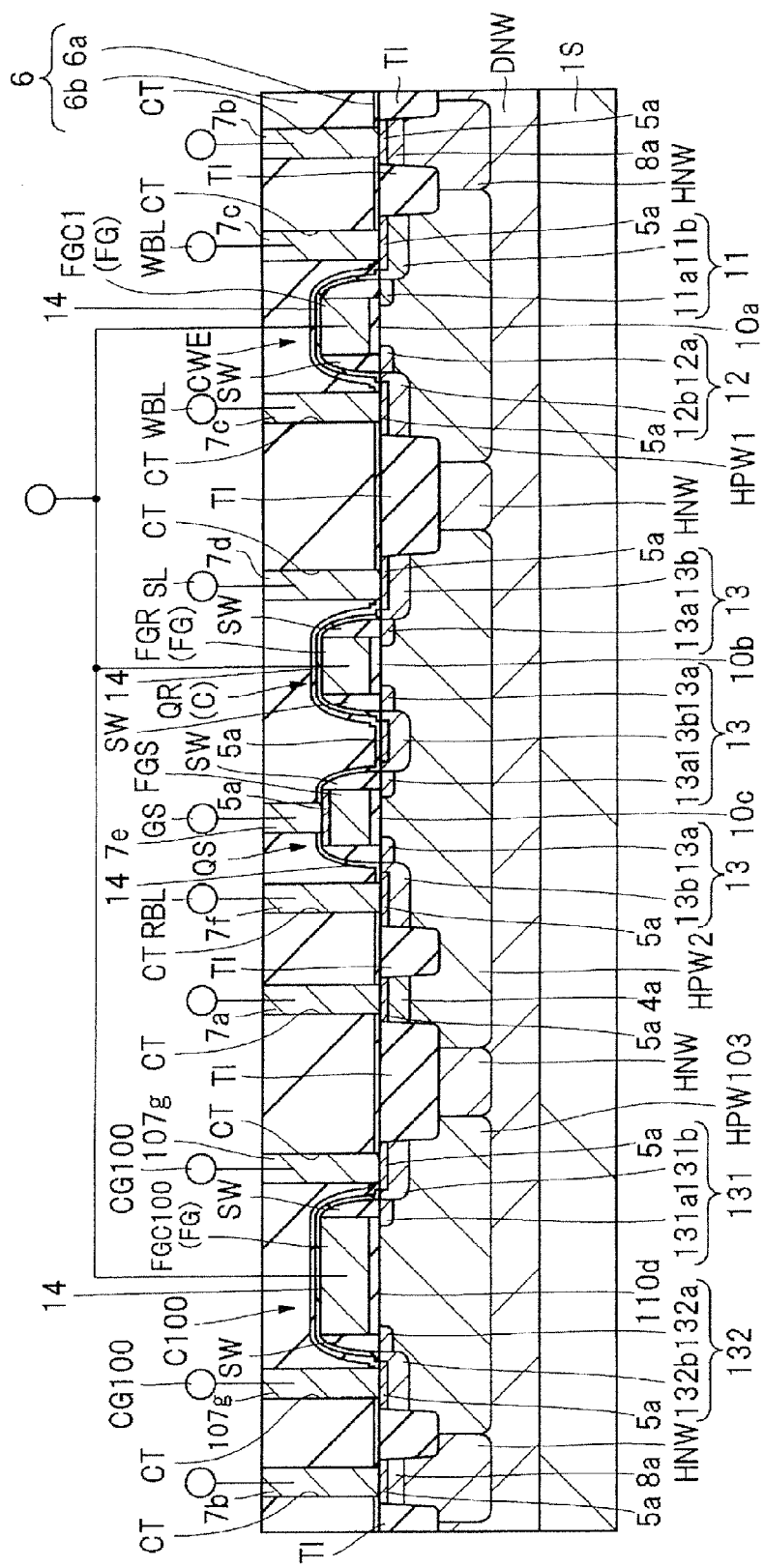
FIG. 15 is a cross-sectional view of the memory cell in the semiconductor device in Comparative Example 1.

FIG. 13 is a main-portion circuit diagram of a flash memory in a semiconductor device in Comparative Example 1. FIG. 14 is a plan view of the memory cell in the semiconductor device in Comparative Example 1. FIG. 15 is a cross-sectional view of the memory cell in the semiconductor device in Comparative Example 1. FIGS. 14 and 15 show the memory cell corresponding to one bit. FIG. 15 is a cross-sectional view along the line A-A in FIG. 14. It is assumed that, in the plane shown in FIG. 14, the two directions crossing to each other, or preferably orthogonal to each other, are an X-axis direction and a Y-axis direction. In FIG. 14, for improved clarity of illustration, the drawing is partly hatched.

A flash memory in the semiconductor device in Comparative Example 1 has a memory cell array MR100. In the memory cell array MR100 of the flash memory in the semiconductor device in Comparative Example 1, in the same manner as in the memory cell array MR1 in Embodiment 1, the plurality of bit lines WBL for writing/erasing data each extending in the Y-axis direction are arranged along the X-axis direction crossing, or preferably orthogonal to, the Y-axis direction. Also, in the memory cell array MR100, in the same manner as in the memory cell array MR1 in Embodiment 1, the plurality of bit lines RBL for reading data each extending in the Y-axis direction are arranged along the X-axis direction. Also, in the memory cell array MR100, in the same manner as in the memory cell array MR1 in Embodiment 1, the plurality of selection lines GS each extending along the X-axis direction and crossing the bit lines WLB and RBL are arranged along the Y-axis direction.

On the other hand, in the memory cell array MR100, unlike in the memory cell array MR1, a plurality of control gate lines CG100 each extending along the X-axis direction and crossing the bit lines WBL and RBL are arranged along the Y-axis direction. Also, in the memory cell array MR100, unlike in the memory cell array MR1, the plurality of source lines SL each extending along the X-direction and crossing the bit lines WBL and RBL are arranged along the Y-axis direction.

In the vicinity of the points of intersection between the bit lines WBL and RBL and the control gate lines CG100, the source lines SL, and the selection lines GS, memory cells MC100 each corresponding to one bit are electrically coupled thereto.

Each of the memory cells MC100 includes the capacitor element CWE for writing/erasing data, the MISFET QR for reading data, and the selection MISFET QS, similarly to the memory cell MC1 in Embodiment 1. One of the electrodes of the capacitor element CWE for writing/erasing data is electrically coupled to one of the bit lines WBL for writing/erasing data, in the same manner as in the memory cell MC1. The other electrode of the capacitor element CWE for writing/erasing data is formed of a part of the floating gate electrode FG and electrically coupled to the gate electrode of the MISFET QR for reading data, in the same manner as in the memory cell MC1. On the other hand, the drain of the MISFET QR for reading data is electrically coupled to one of the bit lines RBL for reading data via the selection MISFET QS. The source of the MISFET QR for reading data is electrically coupled to one of the source lines SL. The gate electrode of the selection MISFET QS is electrically coupled to one of the selection lines GS.

On the other hand, unlike the memory cell MC1 in Embodiment 1, the memory cell MC100 includes the capacitor element C100. In the memory cell MC100, the other electrode of the capacitor element CWE for writing/erasing data is formed of a part of the floating gate electrode FG and electrically coupled to one of the electrodes of the capacitor element C100, unlike in the memory cell MC1. The other electrode of the capacitor element C100 is electrically coupled to the control gate line CG100.

Thus, similarly to the memory cell MC1 of the flash memory in the semiconductor device in Embodiment 1, the memory cell MC100 of the flash memory in the semiconductor device in Comparative Example 1 has the floating gate electrode FG, the capacitor element CWE for writing/erasing data, and the MISFET QR for reading data. However, unlike the memory cell MC1 of the flash memory in the semiconductor device in Embodiment 1, the memory cell MC100 of the flash memory in the semiconductor device in Comparative Example 1 includes the capacitor element C100. A description will be given below of the capacitor element C100 and portions associated with the capacitor element C100.

In Comparative Example 1, the substrate 1S, the n-type embedded well DNW, and the isolation portions TI each forming the semiconductor device are the same as in Embodiment 1. However, in Comparative Example 1, the isolation portions TI define the active regions L1, L2, L3, L4, and L105.

The n-type embedded well DNW is formed with the p-type wells HPW1, HPW2, and HPW103 and the n-type well HNW. The p-type wells HPW1 and HPW2 and the n-type well HNW are the same as in Embodiment 1. However, in Comparative Example 1, unlike in Embodiment 1, the p-type well HPW103 is formed. The p-type well HPW103 is located so as to be included in the n-type embedded well DNW, while being electrically isolated from the p-type wells HPW1 and HPW2 by the n-type embedded well DNW and the n-type well HNW. Also, the p-type well HPW103 is located so as to extend along the p-type well HPW2. The p-type well HPW103 contains a p-type impurity such as, e.g., boron (B).

In Comparative Example 1, as shown in FIG. 14, the floating gate electrode FG is formed in a state extending along the Y-axis direction so as to two-dimensionally overlap the p-type wells HPW1, HPW2, and HPW103. In the same manner as in Embodiment 1, at the position where the floating gate electrode FG two-dimensionally overlaps the active region L1 in the p-type well HPW1, the capacitor element CWE for writing/erasing data is placed. Also, in the same manner as in Embodiment 1, at the position where the floating gate electrode FG two-dimensionally overlaps the active region L2 in the p-type well HPW2, the MISFET QR for reading data is located.

On the other hand, at the position where the floating gate electrode FG two-dimensionally overlaps the active region L105 of the p-type well HPW103, the capacitor element C100 is placed. The capacitor element C100 includes the capacitor electrode FGC100, a capacitor insulating film 110d, a p-type semiconductor region 131, an n-type semiconductor region 132, and the p-type well HPW103.

The capacitor electrode FGC100 is a portion formed of a part of the floating gate electrode FG and forming the upper electrode of the capacitor element C100.

The capacitor insulating film 100d is made of, e.g., silicon dioxide and formed between the capacitor electrode FG100 and the substrate 1S, i.e., the p-type well HPW103.

The p-type semiconductor region 131 and the n-type semiconductor region 132 are formed at respective positions in the p-type well HPW103 between which the capacitor electrode FGC100 is two-dimensionally interposed by self-alignment with the capacitor electrode FGC100.

The p-type semiconductor region 131 includes a channel-side p$^-$-type semiconductor region 131a, and a p$^+$-type semiconductor region 131b coupled to the p$^-$-type semiconductor region 131a. Each of the p$^-$-type semiconductor region 131a and the p$^+$-type semiconductor region 131b contains a p-type impurity such as, e.g., boron (B). The impurity concentration of the p$^+$-type semiconductor region 131b is set higher than the impurity concentration of the p$^-$-type semiconductor region 131a. The p-type semiconductor region 131 is electrically coupled to a conductor portion 107g in one of the contact holes CT formed in the insulating film 6. The conductor portion 107g is electrically coupled to the control gate line CG110. In a part of the top surface layer of the p$^+$-type semiconductor region 131b which is in contact with the conductor portion 107g, the silicide layer 5a may also be formed.

The n-type semiconductor region 132 includes a channel-side n$^-$-type semiconductor region 132a, and an n$^+$-type semiconductor region 132b coupled to the n$^-$-type semiconductor region 132a. Each of the n$^-$-type semiconductor region 132a and the n$^+$-type semiconductor region 132b contains an n-type impurity such as, e.g., phosphorus (P) or arsenic (As). The impurity concentration of the n$^+$-type semiconductor region 132b is set higher than the impurity concentration of the n$^-$-type semiconductor region 132a. The n-type semiconductor region 132 is electrically coupled to the conductor portion 107g in one of the contact holes CT formed in the insulating film 6. The conductor portion 107g is electrically coupled to the control gate line CG110. In a part of the top surface layer of the n$^+$-type semiconductor region 132b which is in contact with the conductor portion 107g, the silicide layer 5a may also be formed.

Thus, in the semiconductor device in Comparative Example 1, the MISFET QR for reading data and the capacitor element C100 are separately provided.

In Comparative Example 1, in writing data, a positive voltage of, e.g., about 8 V is applied to the p-type well HPW103 of the capacitor element C100, a voltage of, e.g., 0 V is applied to the p-type well HPW2 of the MISFET QR for reading data, and a negative voltage of, e.g., about –8 V is applied to the p-type well HPW1 of the capacitor element CWE for writing/erasing data. With such voltages being applied, electrons are injected as an FN tunnel current from the p-type well HPW1 into the capacitor electrode FGC1 through the capacitor insulating film 10a. Through such an injection of electrons, data is written.

Also, in Comparative Example 1, in erasing data, a negative voltage of, e.g., about –8 V is applied to the p-type well HPW103 of the capacitor element C100, a voltage of, e.g., 0 V is applied to the p-type well HPW2 of the MISFET QR for reading data, and a positive voltage of, e.g., about 8 V is applied to the p-type well HPW1 of the capacitor element CWE for writing/erasing data. With such voltages being applied, the electrons stored in the floating gate electrode FG as the capacitor electrode FGC1 are released as an FN tunnel current into the p-type well HPW1 through the capacitor insulating film 10a. Through such a release of electrons, data is erased.

Further, in Comparative Example 1, in reading data, a voltage of, e.g., about 0 V is applied to the p-type well HPW103, a voltage of, e.g., 0 V is applied to the p-type well HPW2, and a voltage of, e.g., 0 V is applied to the p-type well HPW1. With such voltages being applied, the selection MISFET QS is brought into the ON state. In such a state, the data stored in the memory cell MC100 is read on the basis of the value of a current flowing between the pair of n-type semiconductor regions 13 of the MISFET QR for reading data.

It is assumed that a capacitance value CAPc100 is the capacitance value of the capacitor element C100, a capacitance value CAPr is the capacitance value of the capacitor element C serving also as the MISFET QR for reading data, and a capacitance value CAPwe is the capacitance value of the capacitor element CWE. It is also assumed that a potential difference Vc100 is the potential difference between the p-type well HPW103 forming the lower electrode of the capacitor element C100 and the capacitor electrode FGC100 forming the upper electrode of the capacitor element C100. It is also assumed that a potential difference Vr is the potential difference between the p-type well HPW2 forming the lower electrode of the capacitor element C serving also as the MISFET QR for reading data and the gate electrode FGR as the upper electrode of the capacitor element C. It is also assumed that a potential difference Vwe is the potential difference between the p-type well HPW1 forming the lower electrode of the capacitor element CWE and the capacitor electrode FGC1 forming the upper electrode of the capacitor element CWE.

At this time, when the ratio of the potential difference Vwe to the total sum of the potential differences Vc100, Vr, and Vwe is defined as a coupling ratio RC101 between the capacitor elements C100, C, and CWE, it is possible to easily increase the coupling ratio RC101 in Comparative Example 1. Accordingly, in the semiconductor device in Comparative Example 1, it is possible to easily write data or easily erase data.

On the other hand, in the semiconductor device in Comparative Example 1, in an area ARmc100 (see FIG. 14) where one of the memory cells MC100 is formed, the three p-type wells which are the p-type wells HPW1, HPW2, and HPW103 need to be placed. Accordingly, the area occupied by the area ARmc100 where one of the memory cells MC100 is formed is larger by the area occupied by the p-type well HPW103.

In each of the memory cells MC100 in the semiconductor device in Comparative Example 1, the p-type wells HPW1, HPW2, and HPW103 are arranged to be spaced apart from each other in the Y-axis direction. Of the n-type well HNW, the portion located between the p-type wells HPW1 and HPW2 of one of the memory cells MC100 is assumed to be an n-type well HNW1 and the portion located between the p-type well HPW2 of the memory cell MC100 and the p-type well HPW1 of another memory cell MC100 adjacent to the memory cell MC100 in the Y-axis direction is assumed to be an n-type well HNW2. On the other hand, the portion of the n-type well HNW which is located between the p-type wells HPW2 and HPW103 is assumed to be an n-type well HNW103.

That is, in each of the memory cells MC100 in the semiconductor device in Comparative Example 1, in the area ARmc100 (see FIG. 14) where the memory cell MC100 is formed, the three n-type wells which are the n-type wells HNW1, HNW2, and HNW3 need to be placed. The three n-type wells HNW1, HNW2, and HNW103 do not directly contribute to the function of writing data in the flash memory, but need to be placed. Accordingly, the area occupied by the area ARmc100 where the memory cell MC100 is formed is larger by the area occupied by the three n-type wells HNW1, HNW2, and HNW103.

Thus, in the semiconductor device in Comparative Example 1, the area occupied by each of the memory cells is large. As a result, the capacity of the flash memory cannot easily be increased.

<Main Characteristic Features and Effects of Embodiment 1>

By contrast, the memory cell M1 in the semiconductor device in Embodiment 1 includes the capacitor element CWE for writing/erasing data, the MISFET QR for reading data, and the selection MISFET QS, but does not include the capacitor element C100, unlike the memory cell MC100 in the semiconductor device in Comparative Example 1. That is, the MISFET QR for reading data in the semiconductor device in Embodiment 1 functions as each of the MISFET QR for reading data and the capacitor element C100 in the semiconductor device in Comparative Example 1.

As a result, it is sufficient for only the two p-type wells which are the p-type wells HPW1 and HPW2 to be placed in the area ARmc1 (see FIG. 2) where one of the memory cells MC1 is placed. Unlike in Comparative Example 1, the three p-type wells which are the p-type wells HPW1, HPW2, and HPW103 need not be placed. Accordingly, the area occupied by one of the memory cells MC1 in Embodiment 1 is smaller than the area occupied by one of the memory cells MC100 in Comparative Example 1 by the area occupied by the p-type well HPW103 in Comparative Example 1.

Also, in each of the memory cells MC1 in the semiconductor device in Embodiment 1, the p-type wells HPW1 and HPW2 are arranged to be spaced apart from each other in the Y-axis direction. Of the n-type well HNW, the portion located between the p-type wells HPW1 and HPW2 of one of the memory cells MC1 is assumed to be the n-type well HNW1 and the portion located between the p-type well HPW2 of the memory cell MC1 and the p-type well HPW1 of another memory cell MC1 adjacent to the memory cell MC1 in the Y-axis direction is assumed to be the n-type well HNW2.

That is, in each of the memory cells MC1 in the semiconductor device in Embodiment 1, it is sufficient for only the two n-type wells which are the n-type wells HNW1 and HNW2 to be placed in the area ARmc1 (see FIG. 2) where the memory cell MC1 is formed. Accordingly, the area occupied by the area ARmc1 where one of the memory cells MC1 is formed in Embodiment 1 is smaller than the area occupied by the area ARmc100 where one of the memory cells MC100 is formed in Comparative Example 1 by the area occupied by the n-type well HNW103 in Comparative Example 1.

Thus, in the semiconductor device in Embodiment 1, it is possible to reduce the area occupied by one of the memory cells and easily increase the capacity of the flash memory.

Note that, in Embodiment 1, it may also be possible to collectively change the conductivity types of the individual semiconductor regions such as, e.g., the semiconductor substrate 1S, the n-type embedded well DNW, the p-type wells HPW1 and HPW2, the n-type well HNW, the $p^+$-type semiconductor region $4a$, the $n^+$-type semiconductor region $8a$, the p-type semiconductor region 11, and the n-type semiconductor regions 12 and 13 to the opposite polarities. Alternatively, it may also be possible to change the polarities of the individual voltages applied in a data write operation (the same also applies to Embodiment 2).

(Embodiment 2)

Each of the memory cells in the semiconductor device in Embodiment 1 includes the capacitor element for writing/erasing data, and the MISFET for reading data. By contrast, each of memory cells in a semiconductor device in Embodiment 2 includes an assist capacitor element in addition to the capacitor element for writing/erasing data and the MISFET for reading data.

<Circuit Configuration of Semiconductor Device>

Figure 16:
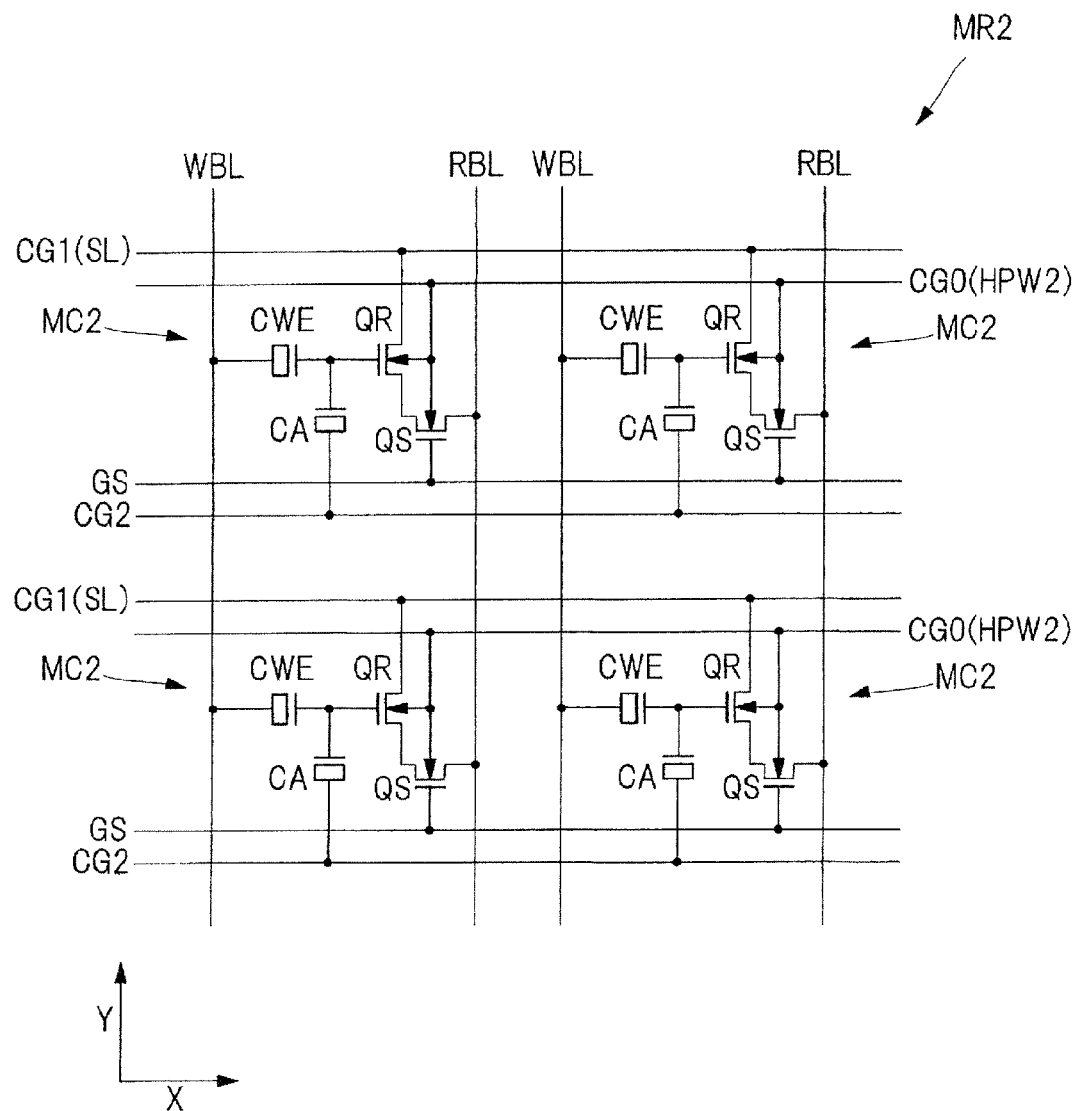
FIG. 16 is a main-portion circuit diagram of a flash memory in a semiconductor device in Embodiment 2.

FIG. 16 is a main-portion circuit diagram of a flash memory in the semiconductor device in Embodiment 2. It is assumed that the two directions crossing, or preferably orthogonal to, each other in the plane shown in FIG. 16 are an X-axis direction and a Y-axis direction.

The flash memory in the semiconductor device in Embodiment 2 has a memory cell array MR2. In the memory cell array MR2, in the same manner as in the memory cell array MR1 in Embodiment 1, the plurality of bit lines WBL for writing/erasing data each extending in the Y-axis direction are arranged along the X-axis direction crossing, or preferably orthogonal to, the Y-axis direction. Also, in the memory cell array MR2, in the same manner as in the memory cell array MR1, the plurality of bit lines RBL for reading data each extending in the Y-axis direction are arranged along the X-axis direction. Also, in the memory cell array MR2, in the same manner as in the memory cell array MR1, the plurality of control gate lines CG1 (source lines SL) and the plurality of control gate lines CG0 (p-type well HPW2) each extending along the X-axis direction and crossing the bit lines WBL and RBL are arranged along the Y-axis direction. Also, in the memory cell array MR2, in the same manner as in the memory cell array MR1, the plurality of selection lines GS each extending along the X-axis direction and crossing the bit lines WBL and RBL are arranged along the Y-axis direction.

On the other hand, in the memory cell array MR2 in Embodiment 2, unlike in the memory cell array MR1, a plurality of control gate lines CG2 each extending along the X-axis direction and crossing the bit lines WBL and RBL are arranged along the Y-axis direction.

In the vicinity of the points of intersection between the bit lines WBL and RBL and the control gate lines CG1 and CG2 and the selection lines GS, memory cells MC2 each corresponding to one bit are electrically coupled thereto. FIG. 16 illustrates the case where one bit is formed of one of the memory cells MC2.

Similarly to each of the memory cells MC1 in Embodiment 1, each of the memory cells MC2 includes the capacitor element CWE for writing/erasing data, the MISFET QR for reading data, and the selection MISFET QS.

In the same manner as in each of the memory cells MC1, one of the electrodes of the capacitor element CWE for writing/erasing data is electrically coupled to one of the bit lines WBL for writing/erasing data. The other electrode of the capacitor element CWE for writing/erasing data is formed of a part of the floating gate electrode FG, which will be described using FIGS. 17 and 18 described later. The gate electrode of the MISFET QR for reading data is formed of another part of the floating gate electrode FG. Consequently, in the same manner as in the memory cell MC1, the other electrode of the capacitor element CWE for writing/erasing data is electrically coupled to the gate electrode of the MISFET QR for reading data. On the other hand, the drain of the MISFET QR for reading data is electrically coupled to one of the bit lines RBL for reading data via the selection MISFET QS. The source of the MISFET QR for reading data is electrically coupled to the control gate line CG1, which is used also as the source line SL. The gate electrode of the selection MISFET QS is electrically coupled to one of the selection lines GS.

However, unlike the memory cell MC1 in Embodiment 1, the memory cell MC2 includes an assist capacitor element CA. One of the electrodes of the assist capacitor element CA is electrically coupled to the control gate line CG2. The other electrode of the assist capacitor element CA is formed of a part of the floating gate electrode FG. Consequently, the other electrode of the assist capacitor element CA is electrically coupled to the other electrode of the capacitor element CWE for writing/erasing data and to the gate electrode of the MISFET QR for reading data.

<Configuration of Memory Cell>

Figure 17:
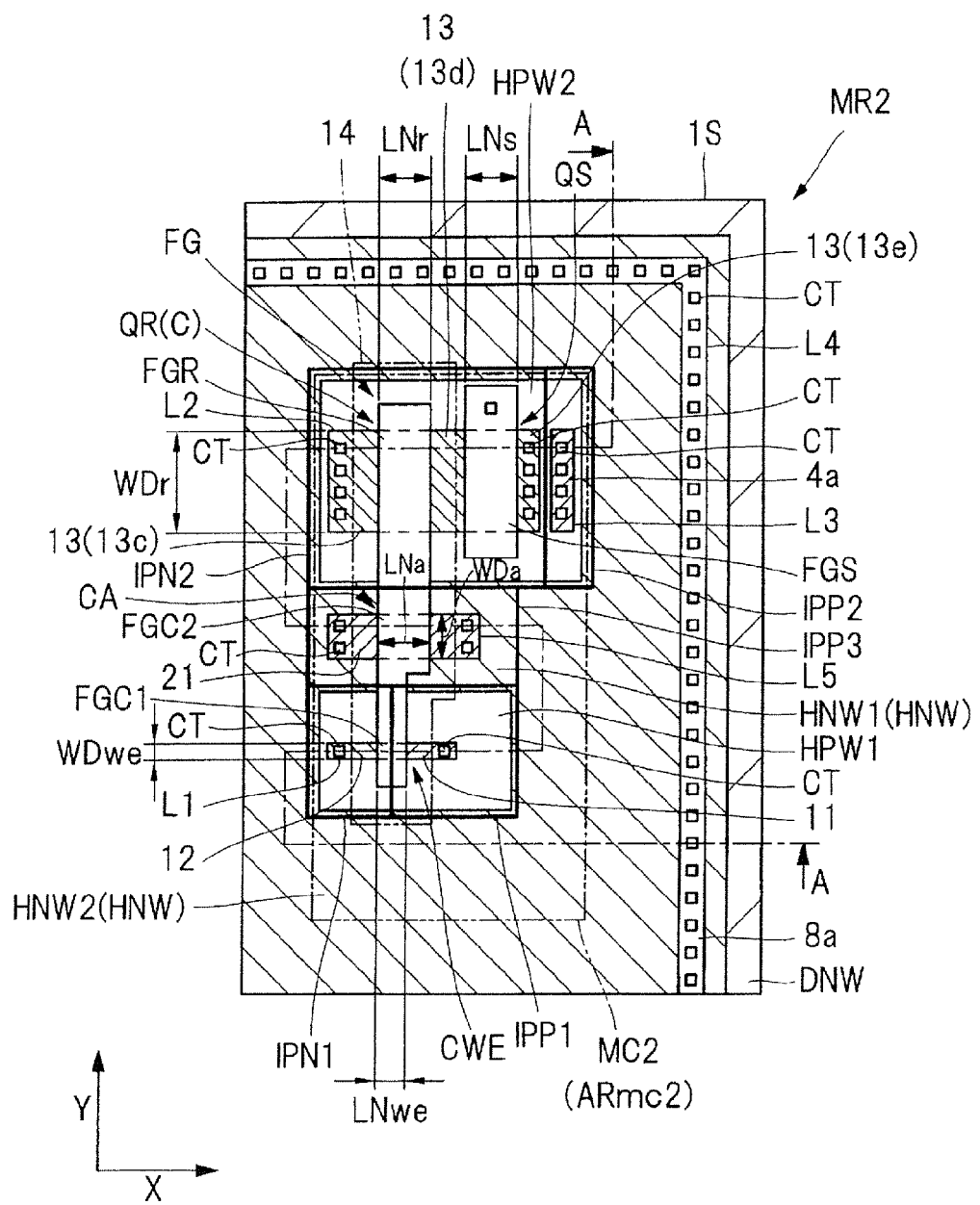
FIG. 17 is a plan view of each of memory cells in the semiconductor device in Embodiment 2.
Figure 18:
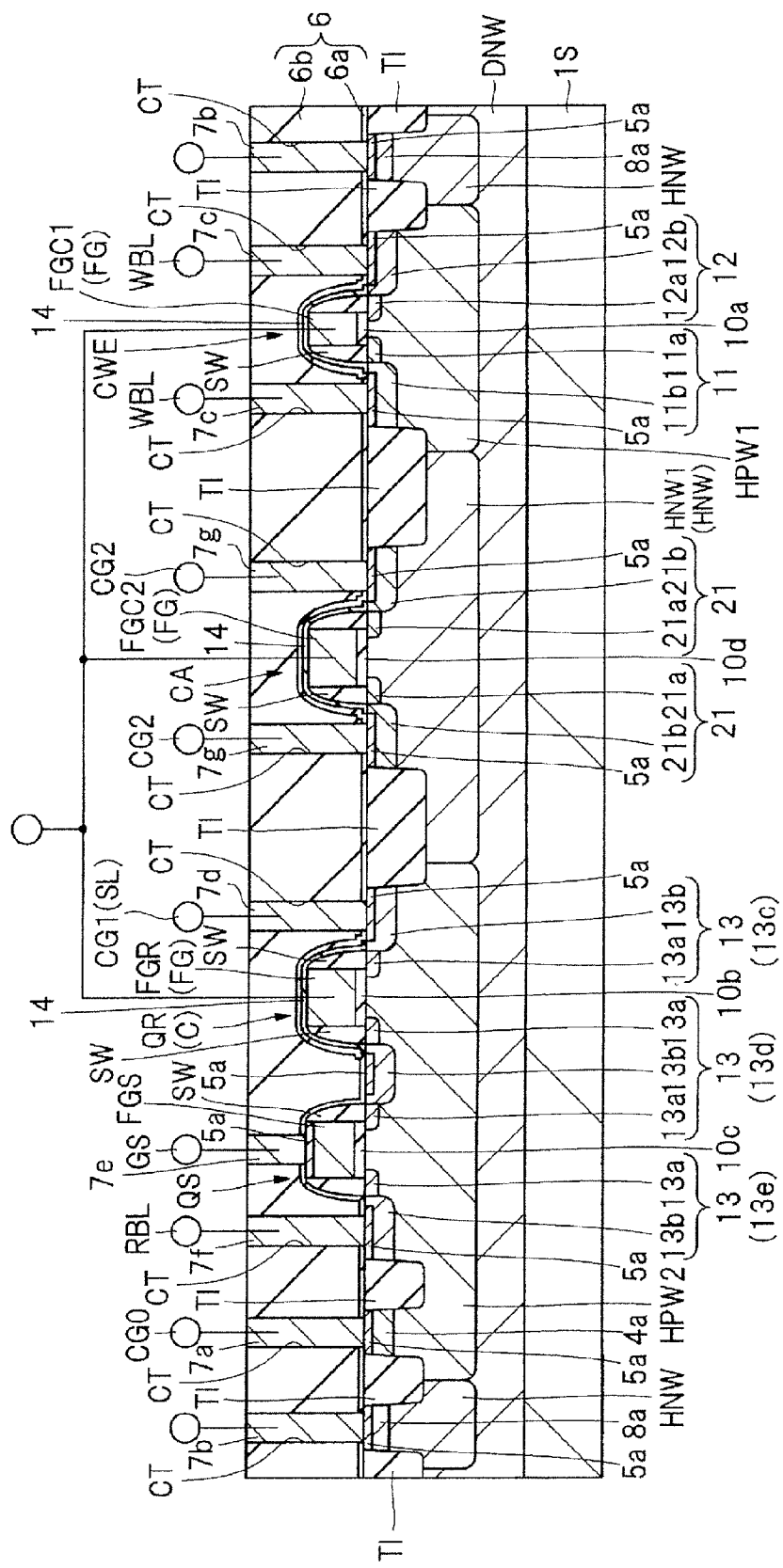
FIG. 18 is a cross-sectional view of the memory cell in the semiconductor device in Embodiment 2.

Next, a description will be given of a configuration of each of the memory cells of the flash memory in the semiconductor device in Embodiment 2. FIG. 17 is a plan view of each of the memory cells in the semiconductor device in Embodiment 2. FIG. 18 is a cross-sectional view of the memory cell in the semiconductor device in Embodiment 2. Each of FIGS. 17 and 18 shows the memory cell corresponding to one bit. FIG. 18 is a cross-sectional view along the line A-A in FIG. 17.

It is assumed that, in the plane shown in FIG. 17, the two directions crossing each other, or preferably orthogonal to each other, are the X-axis direction and the Y-axis direction. FIG. 17 shows the memory cell in a see-through state where the conductor portions 7a to 7g, the insulating film 6, the cap insulating film 14, the silicide layer 5a, the sidewalls SW, and the isolation portions TI have been removed. FIG. 17 shows only the outer periphery of the cap insulating film 14. For improved clarity of illustration, FIG. 17 is partly hatched.

As described above, each of the memory cells MC2 of the flash memory in the semiconductor device in Embodiment 2 includes the floating gate electrode FG, the capacitor element CWE for writing/erasing data, and the MISFET QR for reading data, similarly to each of the memory cells MC1 of the flash memory in the semiconductor device in Embodiment 1. However, unlike the memory cell MC1 in Embodiment 1, the memory cell MC2 in Embodiment 2 includes the assist capacitor element CA. Accordingly, a description will be given below mainly of the assist capacitor element CA and portions associated with the assist capacitor element CA.

The substrate 1S, the n-type embedded well DNW, and the isolation portions TI each forming the semiconductor device are the same as in Embodiment 1. However, in Embodiment 2, the isolation portions TI define the active regions L1, L2, L3, L4, and L5.

In the n-type embedded well DNW, the p-type wells HPW1 and HPW2 and the n-type well HNW are formed. The p-type wells HPW1 and HPW2 and the n-type well HNW are the same as in Embodiment 1.

In the same manner as in Embodiment 1, in Embodiment 2 also, the floating gate electrode FG is formed in a state extending along the Y-axis direction so as to two-dimensionally overlap the p-type wells HPW1 and HPW2, as shown in FIG. 17. In the same manner as in Embodiment 1, at the position where the floating gate electrode FG two-dimensionally overlaps the active region L1 of the p-type well HPW1, the capacitor element CWE for writing/erasing data is placed. Also, in the same manner as in Embodiment 1, at the position where the floating gate electrode FG two-dimensionally overlaps the active region L2 of the p-type well HPW2, the MISFET QR for reading data is placed.

On the other hand, at the position where the floating gate electrode FG two-dimensionally overlaps the active region L5 of the n-type well HNW1 as the portion of the n-type well HNW which is located between the p-type wells HPW1 and HPW2, the assist capacitor element CA as the capacitor element is placed. The assist capacitor element CA includes a capacitor electrode FGC2, a capacitor insulating film 10d, p-type semiconductor regions 21, and the n-type well HNW.

The capacitor electrode FGC2 is formed of a part of the floating gate electrode FG. Here, of the n-type well HNW, the portion located between the p-type wells HPW1 and HPW2 is assumed to be the n-type well HNW1. At this time, the capacitor electrode FGC2 is formed of the portion of the floating gate electrode FG which is formed at the position two-dimensionally overlapping the active region L5 of the n-type well HNW1. The capacitor electrode FGC2 is the portion forming the upper electrode of the assist capacitor element CA.

The capacitor insulating film 10d is made of, e.g., silicon dioxide and formed between the capacitor electrode FGC2 and the substrate 1S, i.e., the n-type well HNW1. The capacitor insulating film 10d is formed by, e.g., a thermal oxidation process and has a thickness of, e.g., about 12 nm.

The pair of p-type semiconductor regions 21 are formed at respective positions in the n-type well HNW1 between which the capacitor electrode FGC2 is two-dimensionally interposed by self-alignment with the capacitor electrode FGC2.

Each of the p-type semiconductor regions 21 includes a channel-side $p^-$-type semiconductor region 21a, and a $p^+$-type semiconductor region 21b coupled to the $p^-$-type semiconductor region 21a. The $p^-$-type semiconductor region 21a and the $p^+$-type semiconductor region 21b contain impurities each having the same conductivity type such as, e.g., boron (B). However, the impurity concentration of the $p^+$-type semiconductor region 21b is set higher than the impurity concentration of the $p^-$-type semiconductor region 21a. The p-type semiconductor regions 21 are electrically coupled to the conductor portions 7g in the contact holes CT formed in the insulating film 6. The conductor portions 7g are electrically coupled to the control gate lines CG2. In parts of the top surface layers of the $p^+$-type semiconductor regions 21b which are in contact with the conductor portions 7g, the silicide layers 5a may also be formed.

Each of the p-type semiconductor regions 21 is electrically coupled to the n-type well HNW1. Accordingly, the n-type well HNW1 is the portion forming the lower electrode of the assist capacitor element CA.

In Embodiment 2 also, in the same manner as in Embodiment 1, the length LNwe of the capacitor electrode FGC1 of the capacitor element CWE for writing/erasing data in the X-axis direction is smaller than the length LNr of the gate electrode FGR of the MISFET QR for reading data in the X-axis direction. This allows the capacitance value of the capacitor element CWE for writing/erasing data to be set smaller than the capacitance value of the capacitor element C serving also as the MISFET QR for reading data. Also, in the same manner as in Embodiment 1, by setting the capacitance value of the capacitor element CWE smaller than the capacitance value of the capacitor element C, writing/erasing of data can easily be performed.

In Embodiment 2 also, such a portion is not provided in which the length of the capacitor electrode FGC100 of the capacitor element C100 (see FIG. 14) described above in Comparative Example 1, i.e., the length of the floating gate electrode FG in the X-axis direction is larger than the length of the gate electrode FGR of the MISFET QR for reading data in the X-axis direction. In such a case, it is preferable that the gate electrode FGR of the MISFET QR for reading data is a portion where the length of the floating gate electrode FG in the X-axis direction is largest.

On the other hand, in Embodiment 2, unlike in Embodiment 1, the assist capacitor element CA is formed. Accordingly, the capacitance value of the capacitor element CWE for writing/erasing data can easily be set smaller than the sum of the capacitance value of the capacitor element C serving also as the MISFET QR for reading data and the capacitance value of the assist capacitor element CA. As will be described in an example of a data write operation in the flash memory described later, by setting the capacitance value of the capacitor element CWE smaller than the sum of the capacitance value of the capacitor element C and the capacitance value of the assist capacitor element CA, the coupling ratio in writing data can easily be increased. This allows data to be more easily written than in Embodiment 1.

Preferably, the length LNwe of the capacitor electrode FGC1 of the capacitor element CWE for writing/erasing data in the X-axis direction is smaller than a length LNa of the capacitor electrode FGC2 of the assist capacitor element CA in the X-axis direction. Accordingly, the capacitance value of the capacitor element CWE for writing/erasing data can more easily be set smaller than the sum of the capacitance value of the capacitor element C serving also as the MISFET QR for reading data and the capacitance value of the assist capacitor element CA. This allows data to be far more easily written than in Embodiment 1.

In Embodiment 2 also, in the same manner as in Embodiment 1, it is preferable that the length LNs of the gate electrode FGS of the selection MISFET QS in the X-axis direction is larger than the length LNr of the gate electrode FGR in the X-axis direction. This can prevent or inhibit a punch-through in the selection MISFET QS and reduce a leakage current in the OFF state, i.e., OFF leakage current. On the other hand, in the MISFET QR for reading data, it is less necessary to prevent or inhibit a punch-through than in the selection MISFET QS. Accordingly, the length LNr of the gate electrode FGR in the X-axis direction may also be smaller than the length LNs of the gate electrode FGS in the X-axis direction.

In Embodiment 2 also, in the same manner as in Embodiment 1, it is preferable that the width WDwe of the portion of the capacitor electrode FGC1 which is interposed between the p-type semiconductor region 11 and the n-type semiconductor region 12 in the Y-axis direction is smaller than the width WDr of the portion of the gate electrode FGR which is interposed between the n-type semiconductor regions 13c and 13d in the Y-axis direction. As a result, the width WDr of the gate electrode FGR in the Y-axis direction relatively increases to allow an increase in the read current flowing in the MISFET QR for reading data and allow for high-speed reading.

<Example of Data Write Operation>

Figure 19:
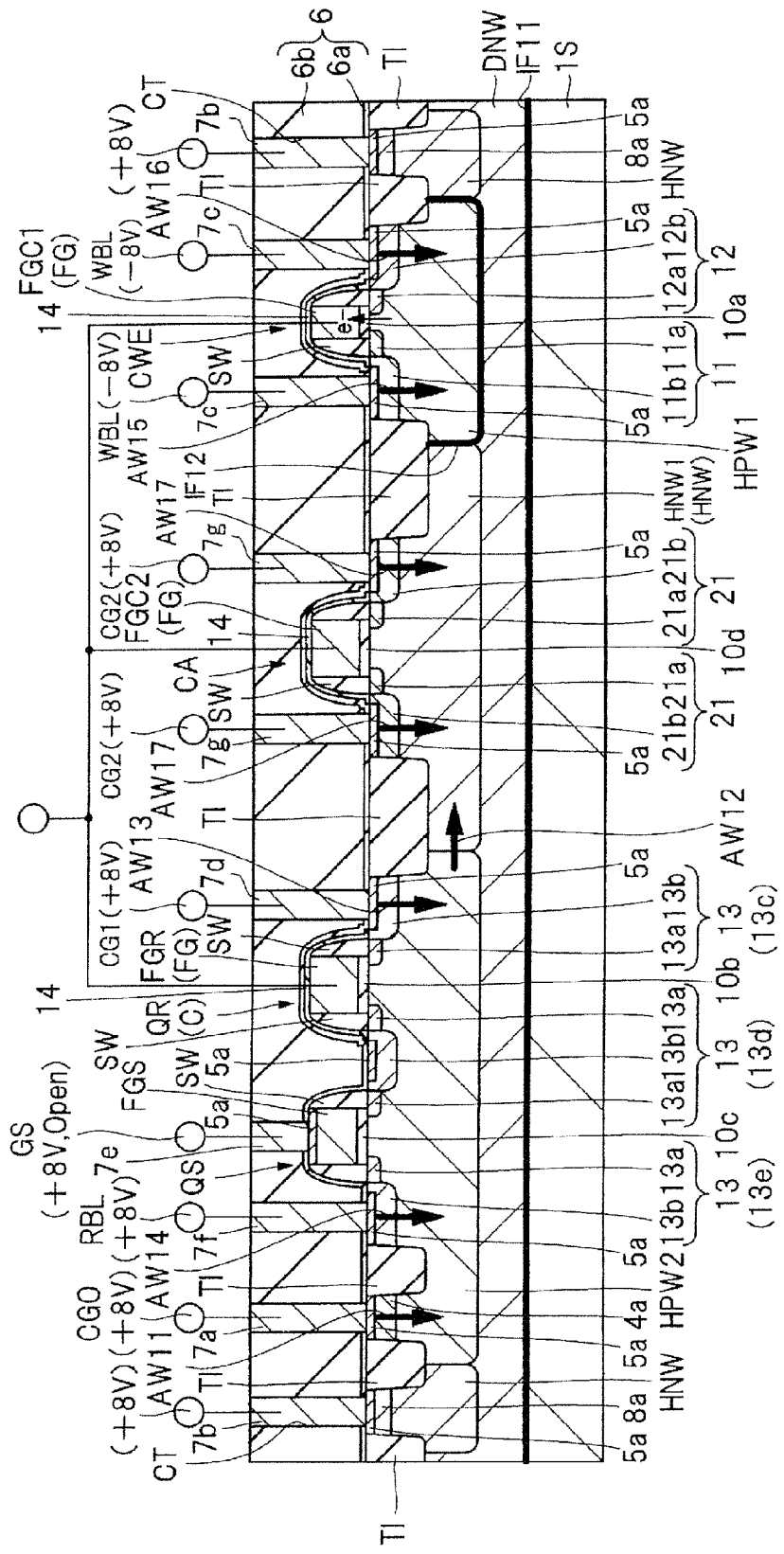
FIG. 19 is a cross-sectional view showing an example of voltages applied to the individual portions of the memory cell in a data write operation in the flash memory in Embodiment 2.

Next, a description will be given of an example of a data write operation in such a flash memory. FIG. 19 is a cross-sectional view showing an example of voltages applied to the individual portions of the memory cell in a data write operation in the flash memory in Embodiment 2. FIG. 19 is a cross-sectional view along the line A-A in FIG. 17.

In writing data, on the portions other than the assist capacitor element CA, generally the same operation as described in Embodiment 1 using FIG. 4 is performed. First, by the same operation as in Embodiment 1, the substrate 1S and the p-type wells HPW1 and HPW2 are electrically isolated from each other. Also, by the same operation as in Embodiment 1, a positive voltage of, e.g., about 8 V is applied to the p-type well HPW2 of each of the MISFET QR for reading data and the selection MISFET QS, while a negative voltage of, e.g., about −8 V is applied to the p-type well HPW1 of the capacitor element CWE for writing/erasing data. In addition, to the gate electrode FGS of the selection MISFET QS, a positive voltage of, e.g., about 8 V is applied or the gate electrode FGS is brought into the open state (shown as "Open" in FIG. 19).

On the other hand, in Embodiment 2, unlike in Embodiment 1, a positive voltage of, e.g., about 8 V is applied from each of the control gate lines CG2 to each of the p-type semiconductor regions 21 of the assist capacitor element CA through each of the conductor portions 7g. At this time, as schematically shown by each of arrows AW17, the potential difference between each of the p-type semiconductor regions 21 coupled to the conductor portions 7g and the n-type well HNW1 is equal to about 0 V. The arrow AW17 means that the potential difference between the starting end and terminating end of the arrow is equal to about 0 V.

Thus, to each of the n-type embedded well DNW and the p-type well HPW2 forming the lower electrode of the capacitor element C serving also as the MISFET QR for reading data, a positive voltage of, e.g., about 8 V is applied. On the other hand, to the p-type well HPW1 forming the lower electrode of the capacitor element CWE for writing/erasing data, a negative voltage of, e.g., about −8 V, i.e., voltage having the polarity opposite to the polarity of the voltage applied to the p-type well HPW2 is applied via the p-type semiconductor region 11. Also, to the n-type well HNW1 of the assist capacitor element CA, a positive voltage of, e.g., about 8 V is applied.

By the application of such voltages, the p-type wells HPW1 and HPW2 are individually controlled and the n-type well HNW1 is controlled to have the same potential as that of the p-type well HPW2. As a result, electrons e⁻ are injected as an FN tunnel current from the entire surface of the channel from the p-type well HPW1 into the capacitor electrode FGC1 through the capacitor insulating film 10a or holes are released as an FN tunnel current from the capacitor electrode FGC. In this manner, data is written.

In writing data, the capacitor element C and the assist capacitor element CA are coupled in parallel to each other via the floating gate electrode FG, and the capacitor element CWE is coupled in series to each of the capacitor element C and the assist capacitor element CA via the floating gate electrode FG.

In Embodiment 2 also, in the same manner as in Embodiment 1, it is assumed that the capacitance value CAPr is the capacitance value of the capacitor element C and the capacitance value CAPwe is the capacitance value of the capacitor element CWE. It is also assumed that the potential difference Vr is the potential difference between the p-type well HPW2 forming the lower electrode of the capacitor element C and the gate electrode FGR forming the upper electrode of the capacitor element C. It is also assumed that the potential difference Vwe is the potential difference between the p-type well HPW1 forming the lower electrode of the capacitor element CWE and the capacitor electrode FGC1 forming the upper electrode of the capacitor element CWE.

On the other hand, in Embodiment 2, it is assumed that a capacitance value CAPa is the capacitance value of the assist capacitor element CA and a potential difference Va is the potential difference between the n-type well HNW1 forming the lower electrode of the assist capacitor element CA and the capacitor electrode FGC2 forming the upper electrode of the assist capacitor element CA. As described above, the capacitor element C and the assist capacitor element CA are coupled in parallel to each other via the floating gate electrode FG. Accordingly, the potential difference Va is equal to the potential difference Vr.

At this time, by increasing the ratio of the sum of the capacitance values CAPr and CAPa to the total sum of the capacitance values CAPr, CAPa, and CAPwe, it is possible to increase the coupling ratio RC1 shown in the foregoing expression (1) and increase the potential difference Vwe in the capacitor element CWE. As a result, in the capacitor element CWE, electrons are more likely to be injected as an FN tunnel current into the capacitor electrode FGC1 or holes are more likely to be released as an FN tunnel current from the capacitor electrode FGC1.

Preferably, the capacitor element C, the assist capacitor element CA, and the capacitor element CWE are designed such that the capacitance values CAPr, CAPa, and CAPwe satisfy the following expression (8). By satisfying the following expression (8), it is possible to set the coupling ratio RC1 larger than 0.5 and set the potential difference Vwe larger than each of the potential differences Vr and Va, as shown in the foregoing expression (1). As a result, in the capacitor element CWE, electrons are more likely to be injected as an FN tunnel current into the capacitor electrode FGC1 or holes are more likely to be released as an FN tunnel current from the capacitor electrode FGC1 than in the capacitor element C.

$$CAPr+CAPa>CAPwe \quad (8)$$

In the same manner as in Embodiment 1, it is assumed that the length LNr is the length of the gate electrode FGR in the X-axis direction and the width WDr is the width of the gate electrode FGR in the Y-axis direction. It is also assumed that the length LNwe is the length of the capacitor electrode FGC1 in the X-axis direction and the width WDwe is the width of the capacitor electrode FGC1 in the Y-axis direction. At this time, the area Sr occupied by the gate electrode FGR is given by the foregoing expression (4), and the area Swe occupied by the capacitor electrode FGC1 is given by the foregoing expression (5).

It is also assumed that the length LNa is the length of the capacitor electrode FGC2 in the X-axis direction and a width WDa is the width of the capacitor electrode FGC2 in the Y-axis direction. At this time, an area Sa occupied by the capacitor electrode FGC2 is given by the following expression (9). When, e.g., each of the capacitor insulating films 10a and 10d and the gate insulating film 10b has an equal thickness and an equal dielectric constant, by satisfying the following expression (10), it is possible to satisfy the foregoing expression (8).

$$Sa=LNa \times WDa \quad (9)$$

$$Sr+Sa>Swe \quad (10)$$

Figure 20:
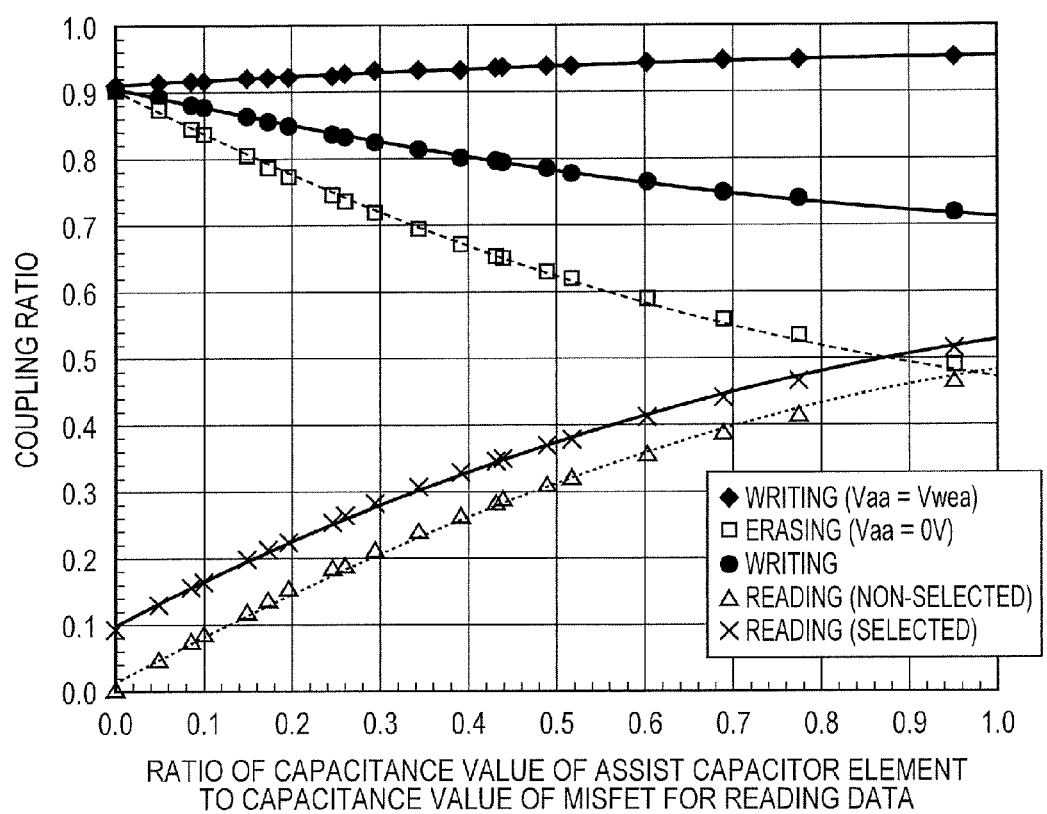
FIG. 20 is a graph showing a coupling ratio when the ratio of the capacitance value of an assist capacitor element to the capacitance value of a MISFET for reading data is varied.

The graph of FIG. 20 shows the coupling ratio when the ratio between the capacitance value CAPr of the MISFET QR for reading data and the capacitance value CAPwe of the capacitor element CWE for writing/erasing data is held constant and the ratio of the capacitance value CAPa of the assist capacitor element CA to the capacitance value CAPr of the MISFET QR for reading data is varied. The abscissa in FIG. 20 represents the ratio of the capacitance value CAPa to the capacitance value CAPr. The ordinate in FIG. 20 shows the coupling ratio. FIG. 20 shows the case where the ratio between the capacitance values CAPr and CAPwe satisfies Capacitance Value CAPr:Capacitance Value CAPwe=0.686: 0.068.

In the graph of FIG. 20, the curve referred to as "Writing" shows the coupling ratio RC1 in writing data. Also, the case where the ratio of the capacitance value CAPa to the capacitance value CAPr is 0 corresponds to the case where the assist capacitor element CA is not formed, i.e., Embodiment 1.

In the graph of FIG. 20, as shown by the curve referred to as "Writing", the coupling ratio RC1 in writing data in the case where the assist capacitor element CA is formed (Embodiment 2) is higher than the coupling ratio RC1 in writing data in the case where the assist capacitor element CA is not formed (Embodiment 1). Therefore, by forming the assist capacitor element CA, in the capacitor element CWE for writing/erasing data, it is possible to easily inject electrons as an FN tunnel current from the p-type well HPW1 into the capacitor electrode FGC1 through the capacitor insulating film 10a and easily write data.

Also, as shown by the curve referred to as "Writing" in FIG. 20, as the capacitance value CAPa of the assist capacitor element CA increases, the coupling ratio RC increases. Therefore, by increasing the capacitance value CAPa of the assist capacitor element CA, it is possible to more easily inject electrons as an FN tunnel current from the p-type well HPW1 into the capacitor electrode FGC1 through the capacitor insulating film 10a in the capacitor element CWE for writing/erasing data and more easily write data.

Figure 21:
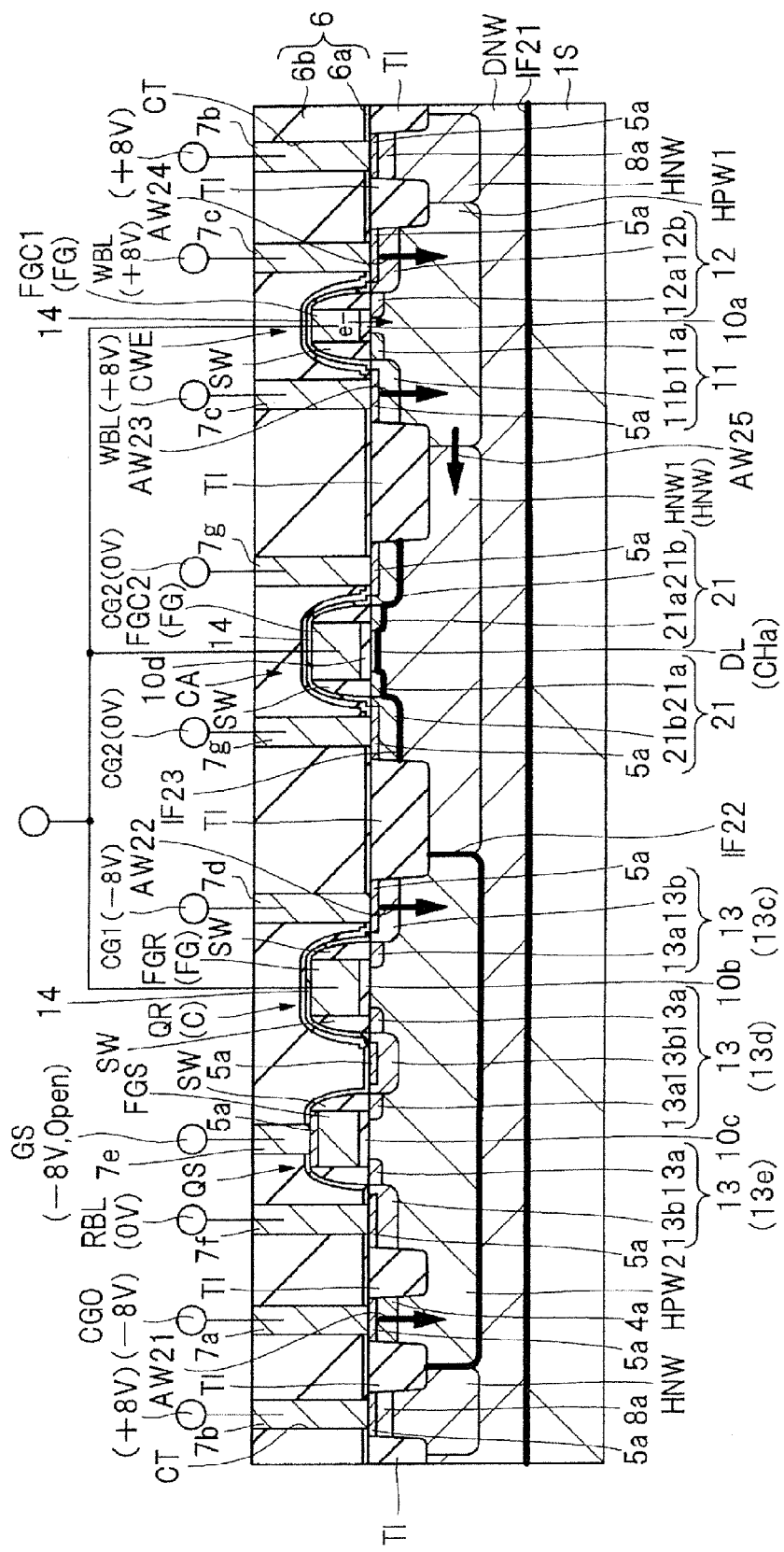
FIG. 21 is a cross-sectional view showing an example of voltages applied to the individual portions of the memory cell in a data erase operation in the flash memory in Embodiment 2.

FIG. 21 is a cross-sectional view showing an example of voltages applied to the individual portions of the memory cell in a data erase operation in the flash memory in Embodiment 2. FIG. 21 is a cross-sectional view along the line A-A in FIG. 17.

In erasing data, on the portions other than the assist capacitor element CA, generally the same operation as described in Embodiment 1 using FIG. 5 is performed. First, by the same operation as in Embodiment 1, the substrate 1S and the p-type wells HPW1 and HPW2 are electrically isolated from each other. Also, by the same operation as in Embodiment 1, a negative voltage of, e.g., about −8 V is applied to the p-type well HPW2 of each of the MISFET QR for reading data and the selection MISFET QS, while a positive voltage of, e.g., about 8 V is applied to the p-type well HPW1 of the capacitor element CWE for writing/erasing data. In addition, to the gate electrode FGS of the selection MISFET QS, a negative voltage of, e.g., about −8 V is applied or the gate electrode FGS is brought into the open state (shown as "Open" in FIG. 21).

On the other hand, in Embodiment 2, unlike in Embodiment 1, a voltage of, e.g., 0 V is applied from each of the control gate lines CG2 to each of the p-type semiconductor regions 21 of the assist capacitor element CA through each of the conductor portions 7g. At this time, to a pn junction at an interface IF23 which is the interface between each of the p-type semiconductor regions 21 and the n-type well HNW1 and shown by the thick line in FIG. 21, a reverse bias is applied and a potential difference of, e.g., about 8 V is produced. Also, in the layer located over the portion where the capacitor electrode FGC2 two-dimensionally overlaps the active region L5 of the n-type well HNW1, i.e., in a region CHa corresponding to a channel, a depletion layer DL is formed. Then, to a pn junction at the interface IF23 which is the interface between the depletion layer DL and the n-type well HNW1 and shown by the thick line in FIG. 21, a reverse bias is applied and a potential difference of, e.g., about 8 V is produced.

Thus, to the n-type embedded well DNW, the voltage having the same polarity as the polarity of the voltage applied to the n-type embedded well DNW in writing data is applied. To the p-type well HPW2 forming the lower electrode of the capacitor element C serving also as the MISFET QR for reading data, a negative voltage of, e.g., about −8 V, i.e., voltage having the polarity opposite to the polarity of the voltage applied to the n-type embedded well DNW in writing data is applied. To the p-type well HPW1 forming the lower electrode of the capacitor element CWE for writing/erasing data, a positive voltage of, e.g., about 8 V, i.e., voltage having the same polarity as the polarity of the voltage applied to the n-type embedded well DNW in writing data is applied. Also, to the n-type well HNW1 of the assist capacitor element CA, a voltage of, e.g., 0 V is applied.

By the application of such voltages, the p-type wells HPW1 and HPW2 are individually controlled and the n-type well HNW1 is controlled to have the same potential as that of the p-type well HPW1. As a result, the electrons e stored in the floating gate electrode FG as the capacitor electrode FGC1 are released as an FN tunnel current from the entire surface of the channel into the p-type well HPW1 through the capacitor insulating film 10a or holes are injected as an FN tunnel current into the capacitor electrode FGC1. In this manner, data is erased.

When the depletion layer DL is not formed in the region CH1, the potential difference between the p-type well HPW1 forming the lower electrode of the capacitor element CWE and the region CHa is equal to about 0 V. At this time, the capacitor element CWE and the assist capacitor element CA are coupled in parallel to each other via the floating gate electrode FG so that the capacitor element C is coupled in series to each of the capacitor element CWE and the assist capacitor element CA via the floating gate electrode FG. Consequently, the coupling ratio RC1 shown in the foregoing expression (1) decreases.

On the other hand, when a voltage of, e.g., 0 V is applied to each of the p-type semiconductor regions 21 and the depletion layer DL is formed in the region CHa, the positive voltage of, e.g., about 8 V applied to the n-type well HNW is not applied to the region CHa. As a result, the coupling ratio RC1 shown in the foregoing expression (1) becomes higher than when the depletion layer DL is not formed in the region CHa. Accordingly, when the depletion layer DL is formed in the region CHa, in the capacitor element CWE, electrons are more likely to be released as an FN tunnel current from the capacitor electrode FGC1 or holes are more likely to be injected as an FN tunnel current into the capacitor electrode FGC1 than when the depletion layer DL is not formed in the region CHa.

It is assumed here that a voltage Vaa is the voltage applied to each of the p-type semiconductor regions 21 of the assist capacitor element CA and a voltage Vwea is the voltage applied to the p-type well HPW1 forming the lower electrode of the capacitor element CWE. The graph of FIG. 20 shows the coupling ratio RC1 when the ratio of the capacitance value CAPa to the capacitance value CAPr is varied in each of the cases where the voltage Vaa is 0 V (Vaa=0) and where the voltage Vaa is equal to the voltage Vwea (Vaa=Vwea).

In FIG. 20, the curve referred to as "Erasing (Vaa=0)" shows the case where the voltage Vaa is 0 V. Also, in FIG. 20, the curve referred to as "Erasing (Vaa=Vwea)" shows the case where the voltage Vaa is equal to the voltage Vwea.

As shown by the curve referred to as "Erasing (Vaa=0)" in FIG. 20 and the curve referred to as "Erasing (Vaa=Vwea)" in FIG. 20, in the case where the voltage Vaa is 0 V, the coupling ratio RC is higher than in the case where the voltage Vaa is equal to Vwea. Accordingly, by applying a voltage of, e.g., 0 V to each of the p-type semiconductor regions 21, it is possible to easily inject electrons as an FN tunnel current from the p-type well HPW1 of the capacitor element CWE for writing/erasing data into the floating gate electrode FG as the capacitor electrode FGC1 through the capacitor insulating film 10a and easily erase data.

Figure 22:
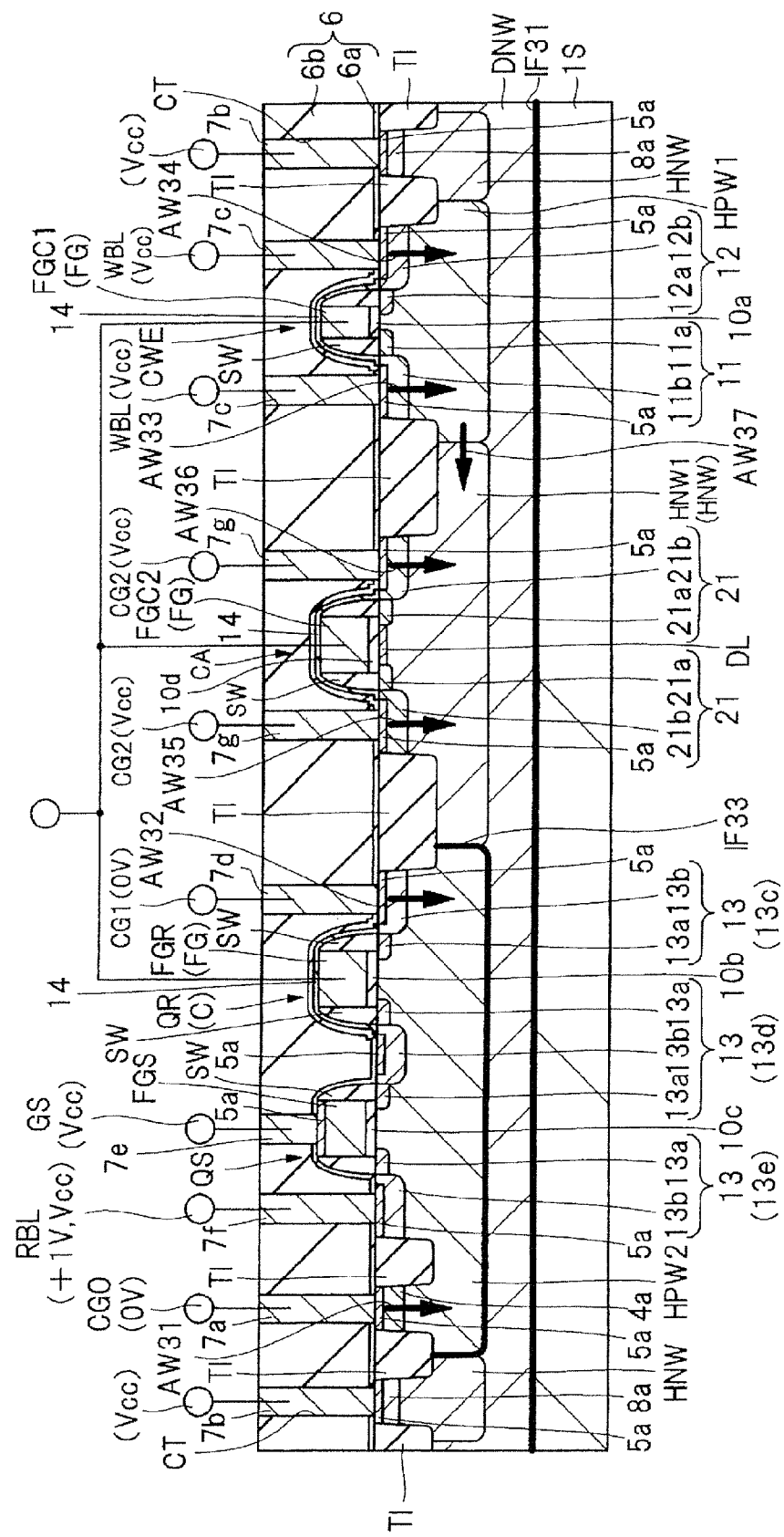
FIG. 22 is a cross-sectional view showing an example of voltages applied to the individual portions of the memory cell in a data read operation in the flash memory in Embodiment 2.

FIG. 22 is a cross-sectional view showing an example of voltages applied to the individual portions of the memory cell in a data read operation in the flash memory in Embodiment 2. FIG. 22 is a cross-sectional view along the line A-A in FIG. 17.

In reading data, on the portions other than the assist capacitor element CA and the capacitor element CWE, generally the same operation as described in Embodiment 1 using FIG. 6 is performed. First, by the same operation as in Embodiment 1, the substrate 1S and the p-type wells HPW1 and HPW2 are electrically isolated from each other. Also, by the same operation as in Embodiment 1, a voltage of 0 V is applied to the p-type well HPW2 of the MISFET QR for reading data, while a voltage of, e.g., about 3 V as a power supply voltage Vcc is applied to the gate electrode FGS of the selection MISFET QS.

On the other hand, in Embodiment 2, unlike in Embodiment 1, a voltage of, e.g., about 3 V as the power supply voltage Vcc is applied from each of the bit lines WBL for writing/erasing data to each of the p-type semiconductor region 11 of the capacitor element CWE for writing/erasing data, the n-type semiconductor region 12 thereof, and the p-type well HPW1 thereof via each of the conductor portions 7c. At this time, since each of the p-type semiconductor region and the p-type well HPW1 is formed of a p-type semiconductor, as schematically shown by an arrow AW33, the potential difference between the p-type semiconductor region 11 and the p-type well HPW1 is equal to about 0 V. The arrow AW33 means that the potential difference between the starting end and terminating end of the arrow is equal to about 0 V. Since the potential difference between the p-type semiconductor region 11 and the p-type well HPW1 is equal to about 0 V, as schematically shown by an arrow AW34, the potential difference between the n-type semiconductor region 12 and the p-type well HPW1 is also equal to about 0 V. The arrow AW34 means that the potential difference between the starting end and terminating end of the arrow is equal to about 0 V.

Also, in Embodiment 2, unlike in Embodiment 1, a voltage of, e.g., about 3 V as the power supply voltage Vcc is applied from each of the control gate lines CG2 to each of the p-type semiconductor regions 21 of the assist capacitor element CA through each of the conductor portions 7g. At this time, as schematically shown by arrows AW35 and AW36, the potential difference between each of the p-type semiconductor regions 21 and the n-type well HNW1 is equal to about 0 V. Each of the arrows AW35 and AW36 means that the potential difference between the starting end and terminating end of the arrow is equal to about 0 V.

Note that, since the forward bias is applied to a pn junction at the interface between the p-type well HPW1 and the n-type well HNW1, as schematically shown by an arrow AW37, the potential difference between the p-type well HPW1 and the n-type well HNW1 is equal to about 0 V. The arrow AW37 means that the potential difference between the starting end and terminating end of the arrow is equal to about 0 V.

Thus, to the n-type embedded well DNW, e.g., the power supply voltage Vcc is applied. Also, to the p-type well HPW2 forming the lower electrode of the capacitor element C serving also as the MISFET QR for reading data, a voltage of, e.g., 0 V is applied while, to the p-type well HPW1 forming the lower electrode of the capacitor element CWE for writing/erasing data, e.g., the power supply voltage Vcc is applied.

Also, in the state where, e.g., the power supply voltage Vcc is applied to the n-type well HNW1 of the assist capacitor element CA, the selection MISFET QS is brought into the ON state. In such a state, the data stored in the selected memory cell, which is either 0 or 1 depending on whether or not a drain current flows in the channel of the MISFET QR for reading data, is read. That is, on the basis of the value of the current flowing between the semiconductor region 13c as one of the pair of n-type semiconductor regions of the MISFET QR for reading data and the n-type semiconductor region 13d as the other of the pair of n-type semiconductor regions 13 thereof, the data stored in the memory cell MC2 is read.

By the application of such voltages, in reading data, the capacitor element CWE and the assist capacitor element CA are coupled in parallel to each other via the floating gate electrode FB so that the capacitor element C is coupled in series to each of the capacitor element CWE and the assist capacitor element CA via the floating gate electrode FG.

At this time, by increasing the ratio of the sum of the capacitance values CAPwe and CAPa to the total sum of the capacitance values CAPr, CAPa, and CAPwe, it is possible to increase the coupling ratio RC2 shown in the foregoing expression (7) and increase the potential difference Vr in the capacitor element C. This can improve reliability in reading the data stored in the memory cell MC2.

The curve referred to as "Reading (Selected)" in the graph of FIG. 20 shows the coupling ratio RC2 in reading.

As shown by the curve referred to as "Reading (Selected)" in the graph of FIG. 20, the coupling ratio RC2 in reading data in the case where the assist capacitor element CA is formed (Embodiment 2) is higher than the coupling ratio RC2 in reading data in the case where the assist capacitor element CA is not formed (Embodiment 1). In addition, as the capacitance value CAPa of the assist capacitor element CA increases, the coupling ratio RC2 increases. For example, in the case where the assist capacitor element CA is not formed, the coupling ratio RC2 is less than 0.1. By contrast, in the case where the assist capacitor element Ca is formed and the ratio of the capacitance value CAPa of the assist capacitor element CA to the capacitance value CAPr of the MISFET QR for reading data is not less than 0.5, the coupling ratio RC2 is higher than 0.3. By thus forming the assist capacitor element CA, it is possible to increase the potential difference between the p-type well HPW2 forming the lower electrode of the capacitor element C serving also as the MISFET QR for reading data and the gate electrode FGR forming the upper electrode thereof and improve reliability in reading the data stored in the memory cell MC2.

Note that the curve referred to as "Reading (Non-Selected)" in the graph of FIG. 20 shows the coupling ratio RC2 in reading in the non-selected memory cell MC2, i.e., the memory cell MC2 in which the selection MISFET QS is not in the ON state. In this case, to the other n-type semiconductor region 13e of the selection MISFET QS, a voltage of, e.g., 0 V is applied from the bit line RBL for reading data through the conductor portion 7f. Also, to the p-type well HPW1 of the capacitor element CWE for writing/erasing data, 0 V is applied from each of the bit lines WBL for writing/erasing data through each of the conductor portions 7c. As shown by the curve referred to as "Reading (Non-Selected)" and the curve referred to as "Reading (Selected)" in the graph of FIG. 20, the coupling ratio RC2 in reading data in the non-selected memory cell MC2 is lower than the coupling ratio RC2 in reading data in the selected memory cell MC2.

<Manufacturing Method of Semiconductor Device>

In a manufacturing method of the semiconductor device in Embodiment 2, the p⁻-type semiconductor regions 21a are formed in a region IPP3 (see FIG. 17) which is included in the region to be formed with the assist capacitor element CA and into which the p-type impurity is to be implanted in forming the p⁻-type semiconductor region 11a in the manufacturing method of the semiconductor device in Embodiment 1. Also, in the manufacturing method of the semiconductor device in Embodiment 2, the p⁺-type semiconductor regions 21b are formed in the region IPP3 (see FIG. 17) which is included in the region to be formed with the assist capacitor element CA and into which the p-type impurity is to be implanted in forming the p⁺-type semiconductor region 11b in the manufacturing method of the semiconductor device in Embodiment 1. The manufacturing method of the semiconductor device in Embodiment 2 can otherwise be the same as the manufacturing method of the semiconductor device in Embodiment 1.

<Main Characteristic Features and Effects of Embodiment 2>

Similarly to the memory cell MC1 in the semiconductor device in Embodiment 1, the memory cell MC2 in the semiconductor device in Embodiment 2 includes the capacitor element CWE for writing/erasing data, the MISFET QR for reading data, and the selection MISFET QS. On the other hand, unlike the memory cell MC1 in the semiconductor device in Embodiment 1, the memory cell MC2 in the semiconductor device in Embodiment 2 includes the assist capacitor element CA.

The assist capacitor element CA is formed in the n-type well HNW1 as the portion of the n-type well HNW which is located between the p-type wells HPW1 and HPW2. This allows the area occupied by an area ARmc2 (see FIG. 17) where one of the memory cells MC2 in Embodiment 2 is formed to be equal to the area occupied by the area ARmc1 (see FIG. 2) where one of the memory cells MC1 in Embodiment 1 is formed. As a result, the semiconductor device in Embodiment 2 has effects similar to the effects of the semiconductor device in Embodiment 1, such as the effect of, e.g., allowing a reduction in the area occupied by one of the memory cells.

Each of the memory cells MC2 in the semiconductor device in Embodiment 2 further includes the assist capacitor element CA to allow the coupling ratio RC1 in writing data to be set higher than in Embodiment 1. In addition, in writing data, it is also possible to increase the potential difference between the p-type well HPW1 forming the lower electrode of the capacitor element CWE for writing/erasing data and the capacitor electrode FGC1 forming the upper electrode thereof. As a result, in the capacitor element CWE, electrons are more likely to be injected as an FN tunnel current into the capacitor electrode FGC1 than in Embodiment 1. For such a reason, data can easily be written.

In the semiconductor device in Embodiment 1, when the capacitance value CAPr is larger than the capacitance value CAPwe, in reading data, the potential difference between the p-type well HPW2 forming the lower electrode of the capacitor element C serving also as the MISFET QR for reading data and the gate electrode FGR forming the upper electrode thereof cannot easily be increased.

However, in the semiconductor device in Embodiment 2, the voltage applied to each of the p-type semiconductor regions 21 in the assist capacitor element CA in reading data is adjusted to allow the coupling ratio RC2 in reading data to be more easily increased than in Embodiment 1. As a result, it is possible to increase the potential difference between the p-type well HPW2 forming the lower electrode of the capacitor element C serving also as the MISFET QR for reading data and the gate electrode FGR forming the upper electrode thereof and improve reliability in reading the data stored in the memory cell MC2.

Note that the coupling ratio RC1 in erasing data in Embodiment 2 is slightly lower than the coupling ratio RC1 in erasing data in Embodiment 1. However, while the coupling ratio RC2 in reading data in Embodiment 1 is less than, e.g., 0.1, the coupling ratio RC2 in reading data in Embodiment 2 is higher than, e.g., 0.3. Accordingly, the effect of improving reliability in reading the data stored in the memory cell MC2 in Embodiment 2 is higher than in Embodiment 1.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A semiconductor device, comprising:
a semiconductor substrate;
a first well having a first conductivity type and formed in a main surface of the semiconductor substrate;
a second well having a second conductivity type opposite to the first conductivity type and located so as to be included in the first well;
a third well having the second conductivity type and located so as to be included in the first well and extend along the second well, while being electrically isolated from the second well; and
a nonvolatile memory cell located so as to two-dimensionally overlap the second and third wells,
wherein the nonvolatile memory cell includes:
a floating gate electrode located so as to extend in a first direction and two-dimensionally overlap the second and third wells;
an element for writing/erasing data located at a first position where the floating gate electrode two-dimensionally overlaps the second well; and
a field effect transistor for reading data located at a second position where the floating gate electrode two-dimensionally overlaps the third well,
wherein the element for writing/erasing data includes:
a first electrode formed of a portion of the floating gate electrode which is formed at the first position;
a first insulating film formed between the first electrode and the semiconductor substrate;
a first semiconductor region and a second semiconductor region which are formed at respective positions in the second well between which the first electrode is interposed; and
the second well,
wherein the field effect transistor for reading data includes:
a second electrode formed of a portion of the floating gate electrode which is formed at the second position;
a second insulating film formed between the second electrode and the semiconductor substrate; and
a third semiconductor region and a fourth semiconductor region which are formed at respective positions in the third well between which the second electrode is interposed,
wherein the first semiconductor region has the first conductivity type, the second semiconductor region has the second conductivity type, and each of the third and fourth semiconductor regions has the first conductivity type, and
wherein a length of the first electrode in a second direction crossing the first direction is smaller than a length of the second electrode in the second direction.

2. The semiconductor device according to claim 1, wherein an area occupied by a portion of the first electrode which is interposed between the first and second semiconductor regions is smaller than an area occupied by a portion of the second electrode which is interposed between the third and fourth semiconductor regions.

3. The semiconductor device according to claim 1, wherein the nonvolatile memory cell further includes a selection field effect transistor for selecting the nonvolatile memory cell,
wherein the selection field effect transistor includes:
a gate electrode located so as to extend in the first direction and two-dimensionally overlap a portion of the third well which is opposite to the second electrode relative to the fourth semiconductor region interposed therebetween;
a third insulating film formed between the gate electrode and the semiconductor substrate; and
a fifth semiconductor region formed in the third well,
wherein the gate electrode is electrically isolated from the floating gate electrode,
wherein the field effect transistor for reading data and the selection field effect transistor share the fourth semiconductor region,
wherein the fourth and fifth semiconductor regions are formed at respective positions in the third well between which the gate electrode is interposed, and
wherein a length of the gate electrode in the second direction is larger than the length of the second electrode in the second direction.

4. The semiconductor device according to claim 1, wherein, when a read operation is performed to the nonvolatile memory cell, data stored in the nonvolatile memory cell is read on the basis of a value of a current flowing between the third and fourth semiconductor regions of the field effect transistor for reading data.

5. The semiconductor device according to claim 1, wherein the second electrode is formed of a portion of the floating gate electrode in which a length of the floating gate electrode in the second direction is largest.

6. The semiconductor device according to claim 1, wherein, at any position between the first and second positions, a length of the floating gate electrode in the second direction is not less than the length of the first electrode in the second direction.

7. The semiconductor device according to claim 1, wherein, when a write operation is performed to the nonvolatile memory cell, a first voltage is applied to each of the first and third wells and a second voltage having a polarity opposite to a polarity of the first voltage is applied to the second well via the second semiconductor region to individually control the second and third wells, and
wherein, when an erase operation is performed to the nonvolatile memory cell, a third voltage having the same polarity as the polarity of the first voltage is applied to the first well, the third voltage is applied to the second well via the second semiconductor region, and a fourth voltage having a polarity opposite to the polarity of the first voltage is applied to the third well to individually control the second and third wells.

8. The semiconductor device according to claim 7,
wherein each of the write operation and the erase operation to the nonvolatile memory cell is performed in the element for writing/erasing data using an FN tunnel current.

9. The semiconductor device according to claim 1,
wherein a width of a portion of the first electrode which is interposed between the first and second semiconductor regions in the first direction is smaller than a width of a portion of the second electrode which is interposed between the third and fourth semiconductor regions in the first direction.

10. The semiconductor device according to claim 1, further comprising:
a fourth well having the first conductivity type and located between the second and third wells,
wherein the nonvolatile memory cell further includes a capacitor element located at a third position where the floating gate electrode two-dimensionally overlaps the fourth well,
wherein the capacitor element includes:
a third electrode formed of a portion of the floating gate electrode which is formed at the third position;
a fourth insulating film formed between the third electrode and the semiconductor substrate;
a sixth semiconductor region and a seventh semiconductor region which are formed at respective positions in the fourth well between which the third electrode is interposed; and
the fourth well, and
wherein each of the sixth and seventh semiconductor regions has the second conductivity type.

11. The semiconductor device according to claim 10,
wherein an area occupied by a portion of the first electrode which is interposed between the first and second semiconductor regions is smaller than an area occupied by a portion of the second electrode which is interposed between the third and fourth semiconductor regions.

12. The semiconductor device according to claim 10,
wherein the nonvolatile memory cell further includes a selection field effect transistor for selecting the nonvolatile memory cell,
wherein the selection field effect transistor includes:
a gate electrode located so as to extend in the first direction and two-dimensionally overlap a portion of the third well which is opposite to the second electrode relative to the fourth semiconductor region interposed therebetween;
a fifth insulating film formed between the gate electrode and the semiconductor substrate; and
an eighth semiconductor region formed in the third well,
wherein the gate electrode is electrically isolated from the floating gate electrode,
wherein the field effect transistor for reading data and the selection field effect transistor share the fourth semiconductor region,
wherein the fourth and eighth semiconductor regions are formed at respective positions in the third well between which the gate electrode is interposed, and
wherein a length of the gate electrode in the second direction is larger than the length of the second electrode in the second direction.

13. The semiconductor device according to claim 10,
wherein, when a read operation is performed to the nonvolatile memory cell, data stored in the nonvolatile memory cell is read on the basis of a value of a current flowing between the third and fourth semiconductor regions of the field effect transistor for reading data.

14. The semiconductor device according to claim 10,
wherein the second electrode is formed of a portion of the floating gate electrode in which a length of the floating gate electrode in the second direction is largest.

15. The semiconductor device according to claim 10,
wherein, when a write operation is performed to the nonvolatile memory cell, a first voltage is applied to each of the first and third wells and a second voltage having a polarity opposite to a polarity of the first voltage is applied to the second well via the second semiconductor region to individually control the second and third wells, and
wherein, when an erase operation is performed to the nonvolatile memory cell, a third voltage having the same polarity as the polarity of the first voltage is applied to the first well, the third voltage is applied to the second well via the second semiconductor region, and a fourth voltage having a polarity opposite to the polarity of the first voltage is applied to the third well to individually control the second and third wells.

16. The semiconductor device according to claim 15,
wherein each of the write operation and the erase operation to the nonvolatile memory cell is performed in the element for writing/erasing data using an FN tunnel current.

17. The semiconductor device according to claim 10,
wherein a width of a portion of the first electrode which is interposed between the first and second semiconductor regions in the first direction is smaller than a width of a portion of the second electrode which is interposed between the third and fourth semiconductor regions in the first direction.

* * * * *